(12) United States Patent
Karda et al.

(10) Patent No.: US 11,908,948 B2
(45) Date of Patent: Feb. 20, 2024

(54) MEMORY DEVICES INCLUDING INDIUM-CONTAINING MATERIALS, AND RELATED ELECTRONIC SYSTEMS

(71) Applicant: Micron Technology, Inc., Boise, ID (US)

(72) Inventors: Kamal M. Karda, Boise, ID (US); Guangyu Huang, El Dorado Hills, CA (US); Haitao Liu, Boise, ID (US); Akira Goda, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/821,414

(22) Filed: Aug. 22, 2022

(65) Prior Publication Data

US 2022/0406941 A1 Dec. 22, 2022

Related U.S. Application Data

(63) Continuation of application No. 16/891,462, filed on Jun. 3, 2020, now Pat. No. 11,430,895.

(51) Int. Cl.
| | |
|---|---|
| *H01L 29/786* | (2006.01) |
| *H01L 29/66* | (2006.01) |
| *H10B 41/41* | (2023.01) |
| *H10B 43/40* | (2023.01) |

(52) U.S. Cl.
CPC .... *H01L 29/7869* (2013.01); *H01L 29/66969* (2013.01); *H10B 41/41* (2023.02); *H10B 43/40* (2023.02)

(58) Field of Classification Search
None
See application file for complete search history.

(56) References Cited

U.S. PATENT DOCUMENTS

| | | | |
|---|---|---|---|
| 9,053,977 B2* | 6/2015 | Choi | H01L 29/7926 |
| 9,679,650 B1 | 6/2017 | Sakui | |
| 10,074,431 B2 | 9/2018 | Sakui | |
| 10,283,452 B2* | 5/2019 | Zhu | H01L 27/0688 |
| 10,553,599 B1* | 2/2020 | Chen | H01L 21/76804 |

(Continued)

FOREIGN PATENT DOCUMENTS

WO 2019/104896 A1 6/2019

*Primary Examiner* — Vincent Wall
(74) *Attorney, Agent, or Firm* — TraskBritt

(57) ABSTRACT

A transistor comprises a lower contact structure, a channel structure, a dielectric fill structure, and an upper contact structure. The lower contact structure comprises a first oxide semiconductive material. The channel structure contacts the lower contact structure and comprises a second oxide semiconductive material having a smaller atomic concentration of one or more metals than the first oxide semiconductive material. The dielectric fill structure contacts an inner side surface of the channel structure and has a recessed upper surface relative to the channel structure. The upper contact structure comprises a third oxide semiconductive material having a greater atomic concentration of the one or more metals than the channel structure. The upper contact structure comprises a first portion contacting the upper surface of the dielectric fill structure and the inner side surface of the channel structure, and a second portion contacting the upper surface of the channel structure.

18 Claims, 13 Drawing Sheets

(56) References Cited

U.S. PATENT DOCUMENTS

| | | |
|---|---|---|
| 2010/0065842 A1 | 3/2010 | Yamazaki et al. |
| 2012/0069680 A1 | 3/2012 | Goda et al. |
| 2013/0193400 A1* | 8/2013 | Sandhu ............... H01L 27/2472 257/5 |
| 2013/0285051 A1* | 10/2013 | Tanaka ............... H01L 29/78642 257/43 |
| 2015/0243748 A1* | 8/2015 | Pulugurtha ......... H01L 29/7827 257/329 |
| 2017/0077230 A1* | 3/2017 | Ikeda ................ H01L 27/11565 |
| 2018/0122823 A1* | 5/2018 | Li ...................... H01L 29/7926 |
| 2019/0067375 A1 | 2/2019 | Karda et al. |
| 2019/0067475 A1* | 2/2019 | Liu ................... H01L 29/42364 |
| 2019/0157280 A1 | 5/2019 | Wang et al. |
| 2020/0227429 A1* | 7/2020 | Ji ....................... H01L 29/7827 |
| 2020/0227525 A1* | 7/2020 | Ji ....................... H01L 27/11565 |
| 2020/0258897 A1* | 8/2020 | Yan ................... H01L 27/11573 |
| 2021/0066334 A1* | 3/2021 | Yang ................ H01L 27/11556 |
| 2021/0143284 A1* | 5/2021 | Karda ................ H01L 29/6675 |

* cited by examiner

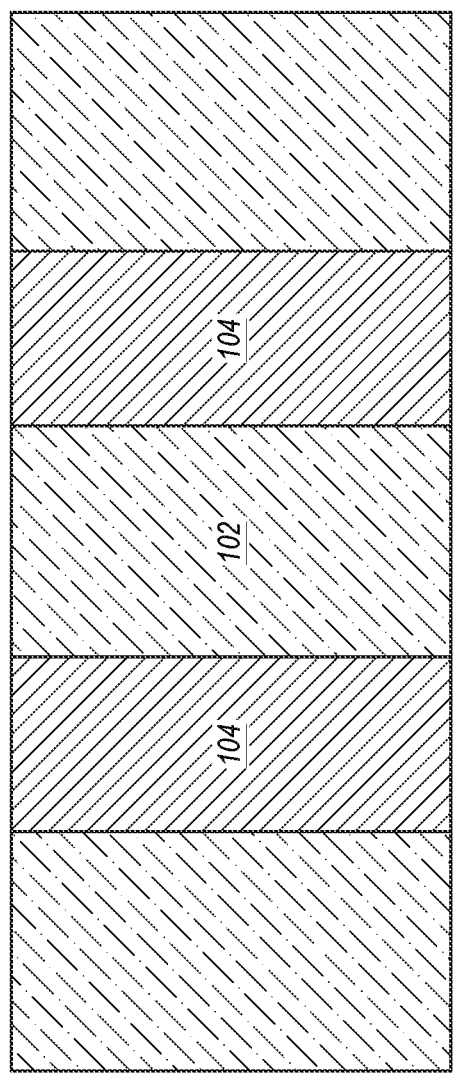

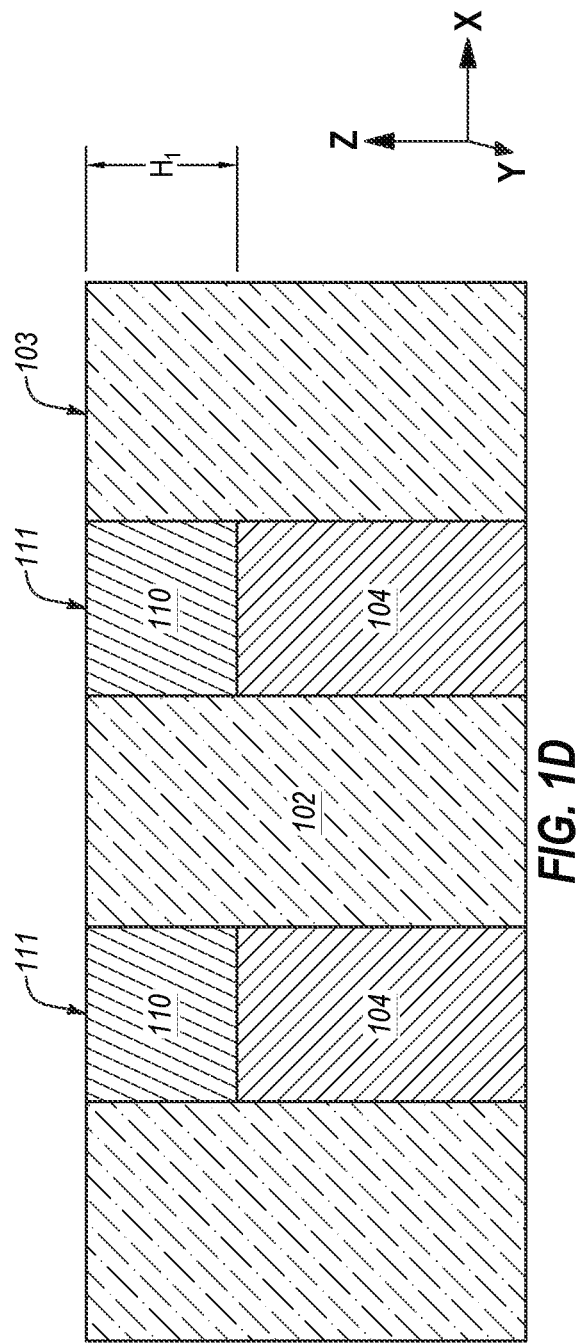

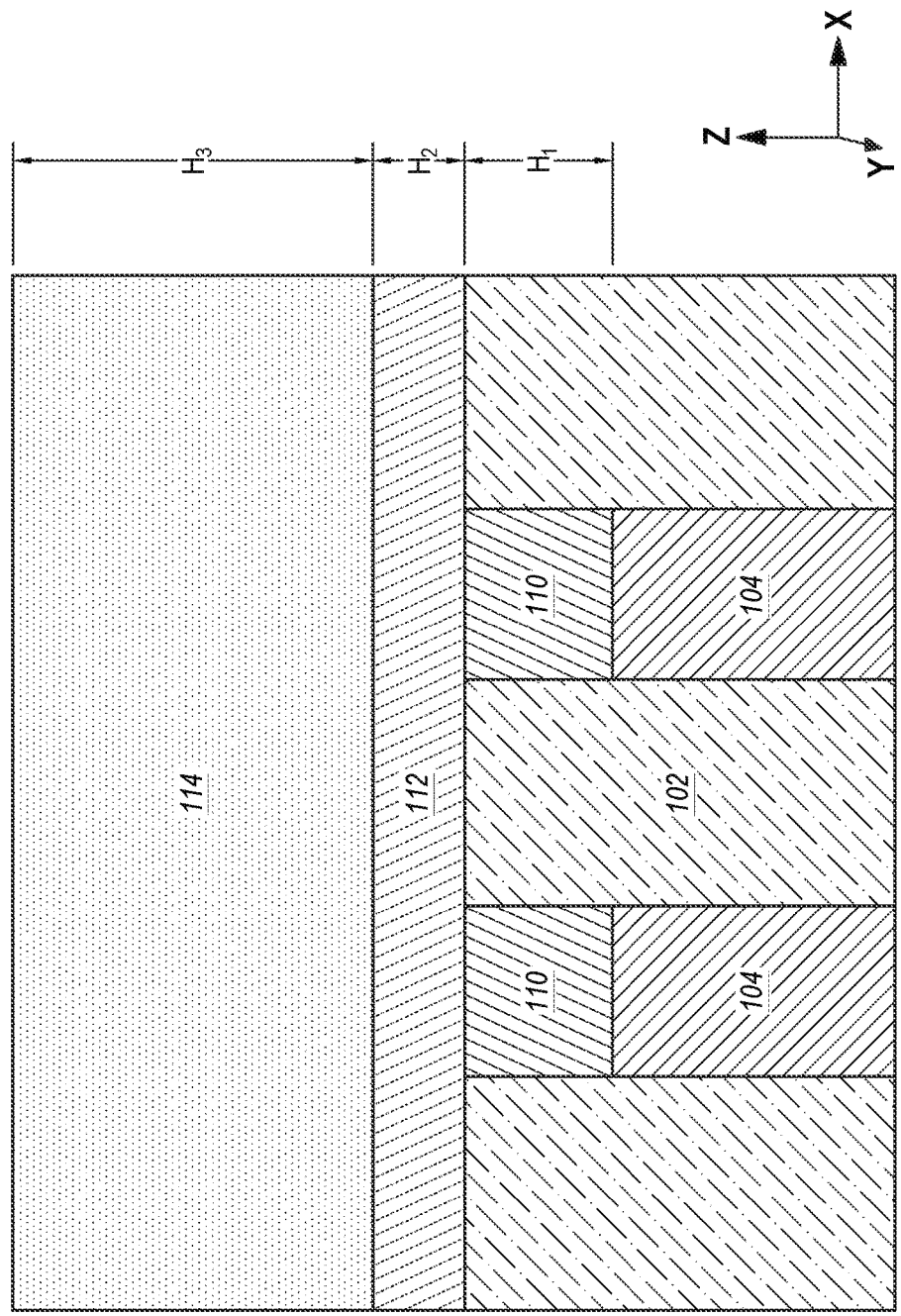

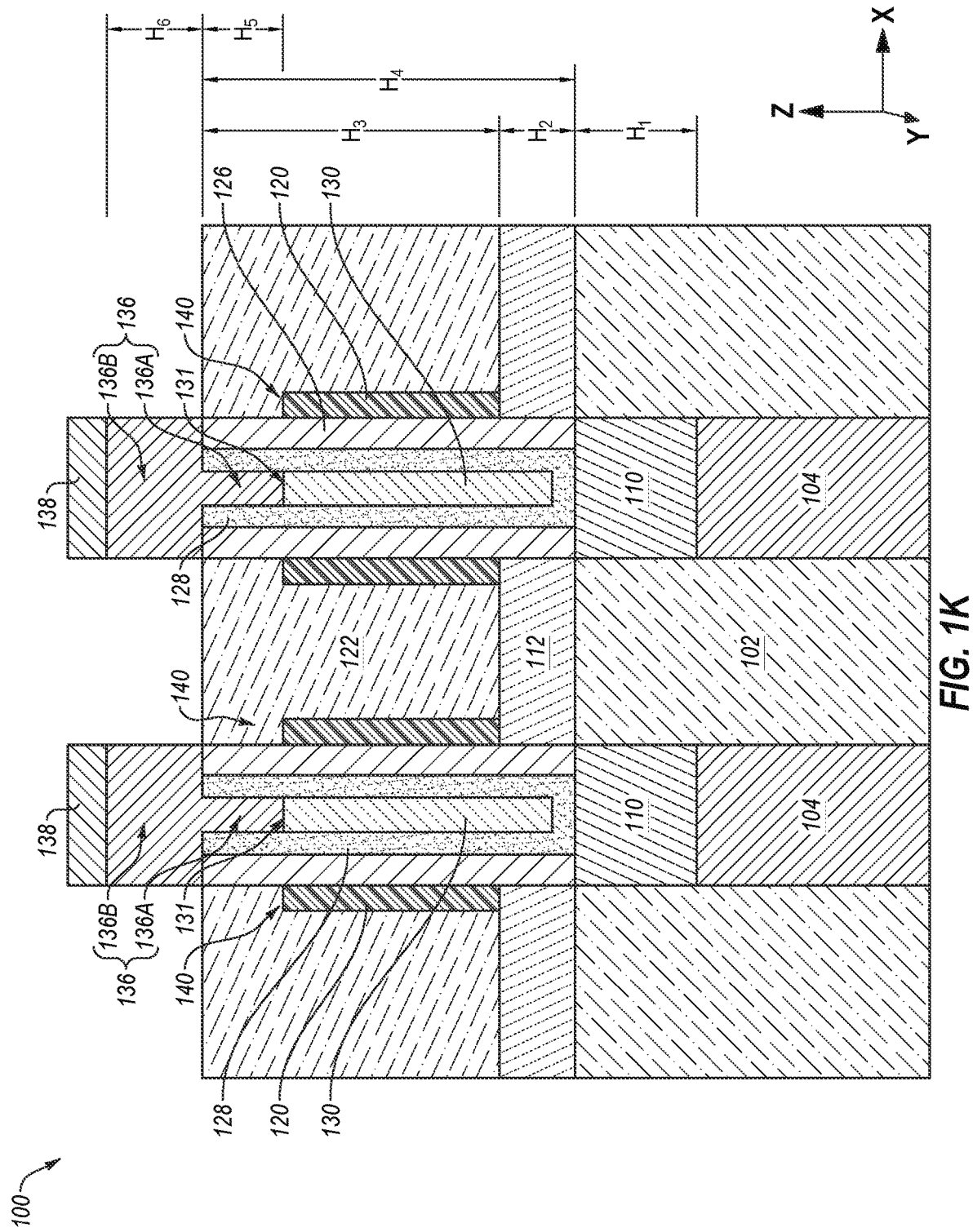

MEMORY DEVICES INCLUDING INDIUM-CONTAINING MATERIALS, AND RELATED ELECTRONIC SYSTEMS

CROSS-REFERENCE TO RELATED APPLICATION

This application is a continuation of U.S. patent application Ser. No. 16/891,462, filed Jun. 3, 2020, now U.S. Pat. No. 11,430,895 issued Aug. 30, 2022, the disclosure of which is hereby incorporated herein in its entirety by this reference.

TECHNICAL FIELD

The disclosure, in various embodiments, relates generally to the field of microelectronic device design and fabrication. More specifically, the disclosure relates to transistors including oxide semiconductive materials, and to related microelectronic devices, memory devices, electronic systems, and methods.

BACKGROUND

A continuing goal of the microelectronics industry has been to increase the memory density (e.g., the number of memory cells per memory die) of memory devices, such as non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes vertical memory strings extending through openings in tiers of conductive structures (e.g., word line plates) and dielectric materials at each junction of the vertical memory strings and the conductive structures. Such a configuration permits a greater number of switching devices (e.g., transistors) to be located in a unit of die area (i.e., length and width of active surface consumed) by building the array upwards (e.g., longitudinally, vertically) on a die, as compared to structures with conventional planar (e.g., two-dimensional) arrangements of transistors.

Conventional vertical memory arrays include electrical connections between the conductive structures and access lines (e.g., word lines) so that memory cells in the vertical memory array can be uniquely selected for writing, reading, or erasing operations. One method of forming such an electrical connection includes forming so-called at least one "staircase" (or "stair step") structures at edges (e.g., horizontal ends) of the tiers of conductive structures. The staircase structure includes individual "steps" defining contact regions of the conductive structures upon which conductive contact structures can be positioned to provide electrical access to the conductive structures.

As vertical memory array technology has advanced, additional memory density has been provided by forming vertical memory arrays to include additional tiers of conductive structures and, hence, additional staircase structures and/or additional steps in individual staircase structures associated therewith. However, increasing the quantity of tiers of conductive structures (and, hence, the quantity of staircase structures and/or the quantity of steps in individual staircase structures) of a stack structure without undesirably increasing the overall width (e.g., lateral footprint) of the stack structure can result in complex and congested routing paths to electrically connect the conductive structures to additional components (e.g., string drivers) of the memory device. Such complex and congested routing paths may impede (or even prevent) desirable connection paths from and between other components of the memory device. In addition, as the quantity of tiers of conductive structures continues to increase, conventional locations for and configurations of the additional components of the memory device have become unable to support increased quantities of the additional components.

In addition, many conventional transistors employed in driving devices (e.g., string drivers) of conventional memory device configurations use semiconductive materials, such as polycrystalline silicon, for the channel structures thereof. However, the use of such materials can result in some less desirable electrical properties in the transistors (e.g., high off current ($I_{off}$), low electron carrier mobility, scattering at an interface between a gate oxide material and the channel). In addition, the relatively small band gaps of such materials can hinder (or even preclude) improvements to other electrical properties (e.g., higher on current ($I_{on}$), faster switching speed, lower operating voltage, reduced current leakage) of the transistor. Other semiconductive materials, such as oxide semiconductor materials, have been investigated as alternatives for polycrystalline silicon for the channel structures of transistors. Such materials can have larger band gaps than polycrystalline silicon, and employing such materials can facilitate improved electrical properties (e.g., lower $I_{off}$) in the transistors. However, oxide semiconductor materials can be difficult to dope, which can, for example, negatively affect the flow of current through a channel structure formed thereof through Schottky barriers at junctions between the channel structure and conventional metallic contact structures (e.g., metallic source contact structures, metallic drain contact structures).

In view of the foregoing, there remains a need for new device (e.g., transistor, microelectronic device, memory device) configurations facilitating enhanced memory density while alleviating the problems (e.g., electronic performance, routing congestion, connection obstacles) of conventional device configurations, as well as for methods of forming the devices, and systems (e.g., electronic systems) including the devices.

BRIEF DESCRIPTION OF THE DRAWINGS

FIGS. 1A through 1K are simplified partial cross-sectional views illustrating a method of forming a microelectronic device, in accordance with embodiments of the disclosure.

DETAILED DESCRIPTION

Figure 1B:
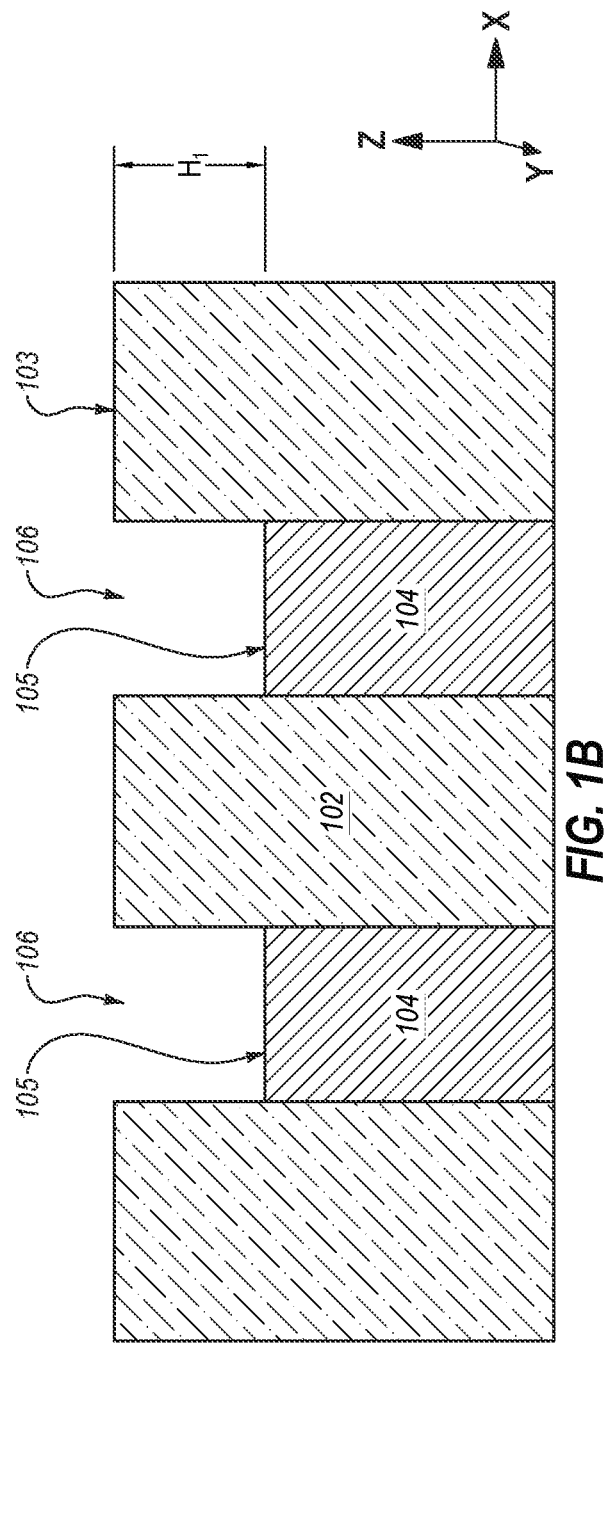

The following description provides specific details, such as material compositions, shapes, and sizes, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional microelectronic device fabrication techniques employed in the industry. In addition, the description provided below does not form a complete process flow for manufacturing a microelectronic device (e.g., a memory device, such as 3D NAND Flash memory device). The structures described below do not form a complete microelectronic device. Only those process acts and structures necessary to understand the embodiments of the disclosure are described in detail below. Additional acts to form a complete microelectronic device from the structures may be performed by conventional fabrication techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, a "memory device" means and includes microelectronic devices exhibiting memory functionality, but not necessarily limited to memory functionality. Stated another way, and by way of non-limiting example only, the term "memory device" includes not only conventional memory (e.g., conventional volatile memory, such as conventional dynamic random access memory (DRAM); conventional non-volatile memory, such as conventional NAND memory), but also includes an application specific integrated circuit (ASIC) (e.g., a system on a chip (SoC)), a microelectronic device combining logic and memory, and a graphics processing unit (GPU) incorporating memory.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure.

As used herein, features (e.g., regions, materials, structures, devices) described as "neighboring" one another means and includes features of the disclosed identity (or identities) that are located most proximate (e.g., closest to) one another. Additional features (e.g., additional regions, additional materials, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, the terms "comprising," "including," "having," and grammatical equivalents thereof are inclusive or open-ended terms that do not exclude additional, unrecited elements or method steps, but also include the more restrictive terms "consisting of" and "consisting essentially of" and grammatical equivalents thereof. As used herein, the term "may" with respect to a material, structure, feature, or method act indicates that such is contemplated for use in implementation of an embodiment of the disclosure and such term is used in preference to the more restrictive term "is" so as to avoid any implication that other, compatible materials, structures, features, and methods usable in combination therewith should or must be excluded.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, "and/or" includes any and all combinations of one or more of the associated listed items.

As used herein, the term "configured" refers to a size, shape, material composition, orientation, and arrangement of one or more of at least one structure and at least one apparatus facilitating operation of one or more of the structure and the apparatus in a pre-determined way.

As used herein, the phrase "coupled to" refers to structures operatively connected with each other, such as electrically connected through a direct Ohmic connection or through an indirect connection (e.g., by way of another structure).

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

Unless the context indicates otherwise, the materials described herein may be formed by any suitable process including, but not limited to, spin coating, blanket coating, chemical vapor deposition (CVD), atomic layer deposition (ALD), plasma enhanced ALD, physical vapor deposition (PVD) (including sputtering, evaporation, ionized PVD, and/or plasma-enhanced CVD), or epitaxial growth. Depending on the specific material to be formed, the technique for depositing or growing the material may be selected by a person of ordinary skill in the art. In addition, unless the context indicates otherwise, the removal of materials described herein may be accomplished by any suitable process including, but not limited to, photolithographic patterning, etching (e.g., dry etching, wet etching, vapor etching), ion milling, abrasive planarization (e.g., chemical-mechanical planarization (CMP)), or other known methods.

FIGS. 1A through 1K are simplified partial cross-sectional views illustrating embodiments of a method of forming a microelectronic device (e.g., a memory device, such as a 3D NAND Flash memory device). With the description provided below, it will be readily apparent to one of ordinary skill in the art that the methods and structures described herein may be used in various devices and electronic systems.

Referring to FIG. 1A, a microelectronic device structure 100 may be formed to include a first isolation material 102, and lower conductive structures 104 vertically extending (e.g., in the Z-direction) through the first isolation material 102. As shown in FIG. 1A, the lower conductive structures 104 may be formed to vertically extend substantially completely through the first isolation material 102.

The first isolation material 102 may be formed of and include at least one dielectric material, such as one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, the first isolation material 102 may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In some embodiments, the first isolation material 102 is formed of and includes $SiO_x$ (e.g., silicon dioxide ($SiO_2$)).

The first isolation material 102 may be substantially homogeneous, or the first isolation material 102 may be heterogeneous. As used herein, the term "homogeneous" means relative amounts of elements included in a feature (e.g., a material, a structure) do not vary throughout different portions (e.g., different horizontal portions, different vertical portions) of the feature. Conversely, as used herein, the term "heterogeneous" means relative amounts of elements included in a feature (e.g., a material, a structure) vary throughout different portions of the feature. If the first isolation material 102 is heterogeneous, amounts of one or more elements included in the first isolation material 102 may vary stepwise (e.g., change abruptly), or may vary continuously (e.g., change progressively, such as linearly, parabolically) throughout different portions of the first isolation material 102. In some embodiments, the first isolation material 102 is substantially homogeneous. In additional embodiments, the first isolation material 102 is heterogeneous. The first isolation material 102 may, for example, be formed of and include a stack (e.g., laminate) of at least two different dielectric materials.

The lower conductive structures 104 may each individually be formed of and include at least one electrically conductive material, such as one or more of at least one metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Jr), nickel (Ni), palladium (Pd), platinum (Pt), copper (Cu), silver (Ag), gold (Au), aluminum (Al)); at least one alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel); at least one conductively doped semiconductor material (e.g., conductively doped polysilicon, conductively doped germanium (Ge), conductively doped silicon germanium (SiGe)); and at least one conductive metal-containing material (e.g., a conductive metal nitride, such as one or more of titanium nitride (TiN), tungsten nitride (WN); a conductive metal silicide; a conductive metal carbide; a conductive metal oxide). In some embodiments, the lower conductive structures 104 are formed of and include W. In additional embodiments, the lower conductive structures 104 are formed of and include TiN.

The lower conductive structures 104 may each be substantially homogeneous, or one or more (e.g., each) of the lower conductive structures 104 may be heterogeneous. If an individual lower conductive structure 104 is heterogeneous, amounts of one or more elements included in the lower conductive structure 104 may vary stepwise (e.g., change abruptly), or may vary continuously (e.g., change progressively, such as linearly, parabolically) throughout different portions of the lower conductive structure 104. In some embodiments, each of the lower conductive structures 104 is substantially homogeneous. In additional embodiments, one or more of the lower conductive structures 104 are heterogeneous. One or more of the lower conductive structures 104 may, for example, individually be formed of and include a stack of at least two different electrically conductive materials.

The lower conductive structures 104 may each individually have a desired geometric configuration (e.g., desired shape and desired dimensions). In some embodiments, the lower conductive structures 104 are formed to have geometric configurations permitting the lower conductive structures 104 to serve as conductive pillar structures for a microelectronic device (e.g., a memory device, such as a 3D NAND Flash memory device) including the microelectronic device structure 100. As a non-limiting example, the lower conductive structures 104 may each be formed to exhibit a columnar shape having circular cross-sectional shape, an oblong cross-sectional shape, a an elliptical cross-sectional shape, a square cross-sectional shape, a rectangular cross-sectional shape, a tear drop cross-sectional shape, a semi-circular cross-sectional shape, a tombstone cross-sectional shape, a crescent cross-sectional shape, a triangular cross-sectional shape, a kite cross-sectional shape, or an irregular cross-sectional shape. In some embodiments, each of the lower conductive structures 104 individually exhibits a circular column shape. Each of the lower conductive structures 104 may be formed to have substantially the same geometric configuration (e.g., substantially the same shape, substantially the same dimensions) as each other of the lower conductive structures 104, or at least one of the lower conductive structures 104 may be formed to have a different geometric configuration (e.g., a different shape, at least one different dimension) than at least one other of the lower conductive structures 104. As a non-limiting example, one or more of the lower conductive structures 104 may be formed to have a different vertical dimension (e.g., in the Z-direction) than one or more other of the lower conductive structures 104. The different vertical dimensions of at least some of the lower conductive structures 104 may, for example, permit at least some of the lower conductive structures 104 to vertically extend to and contact different structures (e.g., different additional conductive structures) vertically underlying the microelectronic device structure 100 than one another, as described in further detail below with reference to FIG. 2.

The microelectronic device structure 100 may be formed to include a desired quantity (e.g., number, amount) of the lower conductive structures 104. While FIG. 1A depicts the microelectronic device structure 100 as being formed to include two (2) of the lower conductive structures 104, the microelectronic device structure 100 may be formed to include more than two (2) (e.g., greater than or equal to eight (8), greater than or equal to sixteen (16), greater than or equal to thirty-two (32), greater than or equal to sixty-four (64), greater than or equal to one hundred and twenty-eight (128), greater than or equal to two hundred and fifty-six (256)) of the lower conductive structures 104, or less than two (2) (e.g., only one (1)) of the lower conductive structures 104.

The first isolation material 102 and the lower conductive structures 104 may be formed using conventional processes (e.g., conventional deposition processes, such as one or more of spin-on coating, blanket coating, CVD, ALD, and PVD; conventional patterning and material removal processes, such as conventional photolithographic exposure processes, conventional development processes, conventional etching processes) and conventional processing equipment, which are not described in detail herein.

Referring next to FIG. 1B, upper portions of the lower conductive structures 104 may be selectively removed relative to the first isolation material 102 to form recessed upper surfaces 105 of the lower conductive structures 104. As shown in FIG. 1B, the recessed upper surfaces 105 of the lower conductive structures 104 may be vertically offset (e.g., in the Z-direction) from an upper surface 103 of the first isolation material 102 by a vertical height $H_1$ (e.g., depth, vertical dimension). The vertical height $H_1$ may be selected at least partially based on predetermined heights of lower contact structures to subsequently be formed on or over the lower conductive structures 104, as described in further detail below. By way of non-limiting example, the vertical height $H_1$ may be within a range of from about 5 nanometers (nm) to about 50 nm.

As shown in FIG. 1B, the selective removal of the upper portions of the lower conductive structures 104 forms openings 106 (e.g., recesses) at least partially defined by the recessed upper surfaces 105 of the lower conductive structures 104 and exposed upper portions of side surfaces (e.g., sidewalls) of the first isolation material 102. The openings 106 may have a horizontal shape and horizontal dimensions (e.g., in the X-direction, in the Y-direction) corresponding to (e.g., substantially the same as) a horizontal shape and horizontal dimensions of the lower conductive structures 104. In additional embodiments, one or more (e.g., each) of the openings 106 may have a horizontal shape and/or horizontal dimensions different than a horizontal shape and/or horizontal dimensions of the lower conductive structures 104. By way of non-limiting example, one or more of the openings 106 may be formed to have different horizontal dimensions (e.g., greater horizontal dimensions, smaller horizontal dimensions) than horizontal dimensions of one or more of the lower conductive structures 104.

The upper portions of the lower conductive structures 104 may be selectively removed by treating the microelectronic device structure 100 with at least one etchant (e.g., at least one wet etchant) formulated to remove exposed portions of the lower conductive structures 104 without substantially removing exposed portions of the first isolation material 102. The microelectronic device structure 100 may be exposed to the etchant using conventional processes (e.g., spin-coating process, a spray-coating process, an immersion-coating process, a vapor-coating process, a soaking process, combinations thereof) and conventional processing equipment, which are not described in detail herein.

Figure 1C:
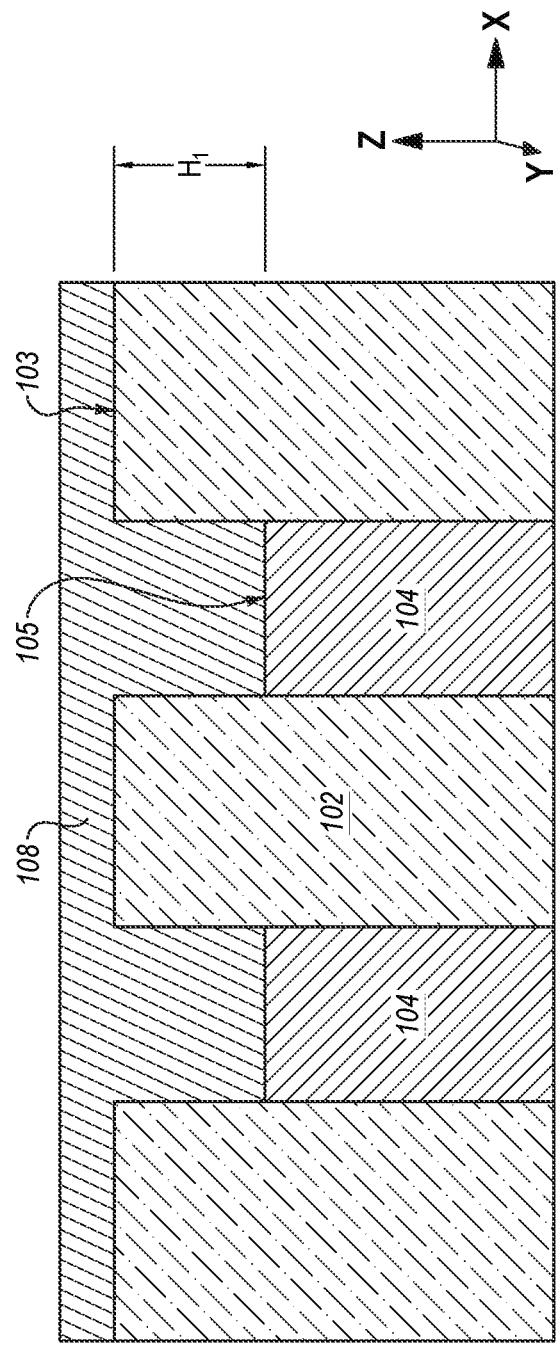

Referring next to FIG. 1C, a lower contact material 108 may be formed on or over exposed surfaces of the microelectronic device structure 100 inside and outside of the openings 106 (FIG. 1B). The lower contact material 108 may be formed to substantially fill the openings 106 (FIG. 1B), and to cover and substantially extend across exposed surfaces (e.g., the upper surface 103 of the first isolation material 102, the recessed upper surfaces 105 of the lower conductive structures 104, side surfaces of the first isolation material 102) of microelectronic device structure 100 at and outside of the boundaries (e.g., horizontal boundaries, vertical boundaries) of the openings 106 (FIG. 1B).

The lower contact material 108 may be formed of and include at least one oxide semiconductive material. For example, the lower contact material 108 may comprise one or more of zinc tin oxide ($Zn_xSn_yO$, commonly referred to as "ZTO"), indium zinc oxide ($In_xZn_yO$, commonly referred to as "IZO"), zinc oxide ($Zn_xO$), indium gallium zinc oxide ($In_xGa_yZn_zO$, commonly referred to as "IGZO"), indium gallium silicon oxide ($In_xGa_ySi_zO$, commonly referred to as "IGSO"), indium tungsten oxide ($In_xW_yO$, commonly referred to as "IWO"), indium oxide ($In_xO$), tin oxide ($Sn_xO$), titanium oxide ($Ti_xO$), zinc oxide nitride ($Zn_xON_z$), magnesium zinc oxide ($Mg_xZn_yO$), zirconium indium zinc oxide ($Zr_xIn_yZn_zO$), hafnium indium zinc oxide ($Hf_xIn_yZn_zO$), tin indium zinc oxide ($Sn_xIn_yZn_zO$), aluminum tin indium zinc oxide ($Al_xSn_yIn_zZn_aO$), silicon indium zinc oxide ($Si_xIn_yZn_zO$), aluminum zinc tin oxide ($Al_xZn_ySn_zO$), gallium zinc tin oxide ($Ga_xZn_ySn_zO$), zirconium zinc tin oxide ($Zr_xZn_ySn_zO$), and other similar materials. Formulae including at least one of "x," "y," "z," and "a" above (e.g., $Zn_xSn_yO$, $In_xZn_yO$, $In_xGa_yZn_zO$, $In_xW_yO$, $In_xGa_ySi_zO$, $Al_xSn_yIn_zZn_aO$) represent a composite material that contains, throughout one or more regions thereof, an average ratio of "x" atoms of one element, "y" atoms of another element (if any), "z" atoms of an additional element (if any), and "d" atoms of a further element (if any) for every one atom of oxygen (O). As the formulae are representative of relative atomic ratios and not strict chemical structure, the channel structures 128 may comprise one or more stoichiometric compounds and/or one or more non-stoichiometric compounds, and values of "x," "y," "z," and "a" may be integers or may be non-integers. In some embodiments, the lower contact material 108 is formed of and includes one or more of $In_xGa_yZn_zO$ and $In_xO$ (e.g., indium (III) oxide, $In_2O_3$). In some embodiments, an initially deposited metal material (e.g., In) is oxidized to form the lower contact material 108 (e.g., $In_xO$, such as $In_2O_3$).

Oxide semiconductive material(s) of the lower contact material 108 may be formed to have different (e.g., greater, lower) atomic concentration(s) of one or more elements (e.g., one or more metals, oxygen) than oxide semiconductive material(s) of channel structures to be formed through subsequent processing of the microelectronic device structure 100. By way of non-limiting example, the lower contact material 108 may be formed to have increased atomic concentration(s) of one or more metals (e.g., one or more of indium (In), tin (Sn), zinc (Zn), gallium (Ga), magnesium (Mg), titanium (Ti), aluminum (Al), and zirconium (Zr)) and/or metalloids (e.g., silicon (Si)) and a decreased atomic concentration of oxygen relative to the channel structures to subsequently be formed. Put another way, the lower contact material 108 may be formed to be metal-rich and oxygen-lean relative to the channel structures to subsequently be formed. In some embodiments, such as embodiments wherein the channel structures are selected to comprise an In-containing oxide semiconductor material (described in further detail below), the lower contact material 108 may be formed to include increased atomic concentrations of In and/or decreased atomic concentrations of oxygen as compared to the channel structures.

The lower contact material 108 may be substantially homogeneous, or the lower contact material 108 may be heterogeneous. If the lower contact material 108 is heterogeneous, amounts of one or more elements included in the lower contact material 108 may vary stepwise (e.g., change abruptly), or may vary continuously (e.g., change progressively, such as linearly, parabolically) throughout different regions of the lower contact material 108. In some embodiments, the lower contact material 108 is substantially homogeneous. In additional embodiments, the lower contact material 108 is heterogeneous. Relatively vertically lower (e.g., in the Z-direction) regions of the lower contact material 108 may, for example, be relatively metal-rich (e.g., In-rich) and oxygen-lean as compared to relatively vertically higher regions of the lower contact material 108. In some embodiments, the lower contact material 108 includes substantially the same elements in all of the different vertical regions thereof, but at least one relatively vertically lower region of the lower contact material 108 includes a different atomic concentration of one or more of the elements than at least one relatively vertically higher region of the lower contact material 108. By way of non-limiting example, the lower contact material 108 may comprise a heterogeneous form of $In_xGa_yZn_zO$, such that each vertical region of the lower contact material 108 includes In, Ga, Zn, and O, but atomic concentration(s) of one or more of In, Ga, Zn, and O (e.g., In and/or O) in at least one relatively vertically lower region is/are different (e.g., relatively greater in In and/or relatively lower in O) than atomic concentration(s) of the one or more of In, Ga, Zn, and O (e.g., In and/or O) in at least one relatively vertically higher region. In additional embodiments, the lower contact material 108 includes different elements in at least one of the different vertical regions thereof than in at least one other of the different vertical regions thereof. The lower contact material 108 may, for example, comprise a stack (e.g., laminate) of two or more (e.g., two, three, more than three) different oxide semiconductor materials. In some such embodiments, a first oxide semiconductor material positioned relatively vertically lower (e.g., in the Z-direction) within the lower contact material 108 may be metal-rich (e.g., In-rich) and/or oxygen-lean relative to a second oxide semiconductor material positioned relatively vertically higher within the lower contact material 108.

The lower contact material 108 may be formed using conventional processes (e.g., conventional deposition processes, such as one or more of spin-on coating, blanket coating, CVD, ALD, and PVD) and conventional processing equipment, which are not described in detail herein.

Referring next to FIG. 1D, portions of the lower contact material 108 (FIG. 1C) outside of the boundaries (e.g., horizontal boundaries, vertical boundaries) of the openings 106 (FIG. 1B) may be removed while retaining additional portions of the lower contact material 108 (FIG. 1C) inside of the boundaries of the openings 106 (FIG. 1B) to form lower contact structures 110. The lower contact structures 110 may be substantially confined within the boundaries (e.g., horizontal boundaries, vertical boundaries) of the openings 106 (FIG. 1B). Upper boundaries of the lower contact structures 110 may be substantially coplanar with an upper boundary of the first isolation material 102. By way of non-limiting example, as shown in FIG. 1D, upper surfaces 111 of the lower contact structures 110 may be formed to be substantially coplanar with the upper surface 103 of the first isolation material 102.

Portions of the lower contact material 108 (FIG. 1C) outside of the boundaries (e.g., horizontal boundaries, vertical boundaries) of the openings 106 (FIG. 1B) may be removed to form the lower contact structures 110 using conventional material removal processes (e.g., conventional etching processes, conventional planarization processes), which are not described in detail herein. As a non-limiting example, portions of the lower contact material 108 (FIG. 1C) outside of the boundaries of the openings 106 (FIG. 1B) may be removed using at least one CMP process to form the lower contact structures 110.

Referring next to FIG. 1E, a second isolation material 112 may be formed on or over the lower contact structures 110 and the first isolation material 102; and a sacrificial material 114 may be formed on or over the second isolation material 112. For example, as shown in FIG. 1E, the second isolation material 112 may be formed on upper surfaces of the lower contact structures 110 (e.g., the upper surfaces 111 (FIG. 1D)) and the first isolation material 102 (e.g., the upper surface 103 (FIG. 1D)); and the sacrificial material 114 may be formed on an upper surface of the second isolation material 112.

The second isolation material 112 may be formed of and include at least one dielectric material having different etch selectivity than the first isolation material 102 and one or more subsequently formed materials (e.g., conductive materials, additional isolation materials). The second isolation material 112 may be selectively etchable relative to the first isolation material 102 and/or the subsequently formed materials during common (e.g., collective, mutual) exposure to a first etchant, and the first isolation material 102 and/or the subsequently formed materials may be selectively etchable relative to the second isolation material 112 during common exposure to a second, different etchant. As used herein, a material is "selectively etchable" relative to another material if the material exhibits an etch rate that is at least about three times (3×) greater than the etch rate of another material, such as about five times (5×) greater, about ten times (10×) greater, about twenty times (20×) greater, or about forty times (40×) greater. By way of non-limiting example, the second isolation material 112 may be formed of and include one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and a $MgO_x$), at least one dielectric nitride material (e.g., $SiN_y$), at least one dielectric oxynitride material (e.g., $SiO_xN_y$), and at least one dielectric carboxynitride material (e.g., $SiO_xC_zN_y$). In some embodiments, such as some embodiments wherein the first isolation material 102 is formed of and includes $SiO_x$ (e.g., $SiO_2$), the second isolation material 112 is formed of and includes $SiN_y$ (e.g., $Si_3N_4$).

The second isolation material 112 may be substantially homogeneous, or the second isolation material 112 may be heterogeneous. If the second isolation material 112 is heterogeneous, amounts of one or more elements included in the second isolation material 112 may vary stepwise (e.g., change abruptly), or may vary continuously (e.g., change progressively, such as linearly, parabolically) throughout different portions of the second isolation material 112. In some embodiments, the second isolation material 112 is substantially homogeneous. In further embodiments, the second isolation material 112 is heterogeneous. The second isolation material 112 may, for example, be formed of and include a stack (e.g., laminate) of at least two different dielectric materials.

The second isolation material 112 may be formed to have a desired vertical height $H_2$. The vertical height $H_2$ of the second isolation material 112 may be selected at least partially based on a desired vertical offset (e.g., in the Z-direction) between the lower contact structures 110 and gate structures (e.g., gate electrodes) to be formed on or over the second isolation material 112 through subsequent processing of the microelectronic device structure 100, as described in further detail below. A deposition process (e.g., a PVD processes, a CVD process, an ALD process) employed to form the second isolation material 112 may, for example, facilitate relatively more precise control of vertical offset as compared to a conventional process (e.g., a conventional gate structure spacing process) employing, for example, one or more subtractive processing acts. By way of non-limiting example, the vertical height $H_2$ of the second isolation material 112 may be within a range of from about 5 nm to about 50 nm.

The sacrificial material 114 may be formed of and include at least one material having different etch selectivity than the second isolation material 112 and one or more subsequently formed materials (e.g., conductive materials, dielectric materials). The sacrificial material 114 may be selectively etchable relative to the second isolation material 112 and/or the subsequently formed materials during common (e.g., collective, mutual) exposure to a first etchant, and the second isolation material 112 and/or the subsequently formed materials may be selectively etchable relative to the sacrificial material 114 during common exposure to a second, different etchant. By way of non-limiting example, the sacrificial material 114 may be formed of and include silicon (e.g., single crystalline silicon, polycrystalline silicon), silicon nitride, a carbon-containing material (e.g., SiOCN), carbon, a photoresist material, or another material. In some embodiments, the sacrificial material 114 is formed of and includes polycrystalline silicon.

The sacrificial material 114 may be formed to have a desired vertical height $H_3$. The vertical height $H_3$ of the sacrificial material 114 may be selected at least partially based on a desired vertical height of channel structures to be formed through subsequent processing of the microelectronic device structure 100, as described in further detail below. By way of non-limiting example, the vertical height $H_3$ of the sacrificial material 114 may be within a range of from about 30 nm to about 200 nm, such as from about 50 nm to about 200 nm, from about 75 nm to about 200 nm, from about 100 nm to about 200 nm, or from about 150 nm to about 200 nm. In some embodiments, the vertical height $H_3$ of the sacrificial material 114 is within a range of from about 50 nm to about 100 nm.

The second isolation material 112 and the sacrificial material 114 may be formed using conventional processes (e.g., conventional deposition processes, such as one or more of spin-on coating, blanket coating, CVD, ALD, and PVD) and conventional processing equipment, which are not described in detail herein.

Figure 1F:
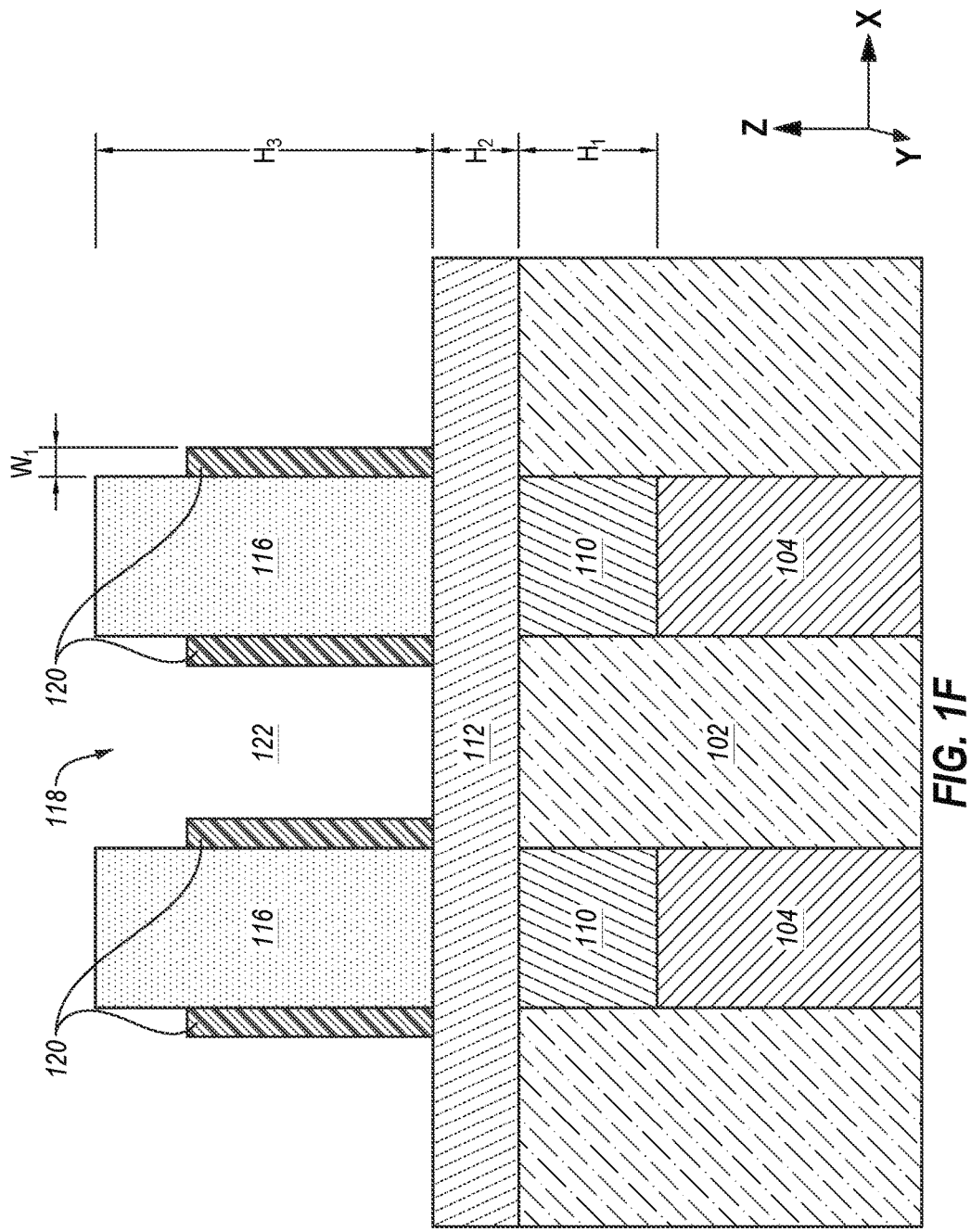

Referring next to FIG. 1F, portions of the sacrificial material 114 (FIG. 1E) may be removed to form sacrificial pillar structures 116 and trenches 118; and gate structures 120 (e.g., gate electrodes) may be formed within the trenches 118. The trenches 118 may horizontally intervene between and separate horizontally neighboring sacrificial pillar structures 116. Each of the sacrificial pillar structures 116 may be at least partially horizontally surrounded by at least one of the gate structures 120.

The sacrificial pillar structures 116 may each individually be formed at a desired horizontal location (e.g., in the X-direction and the Y-direction) on or over the second isolation material 112. As shown in FIG. 1F, in some embodiments, each of the sacrificial pillar structures 116 is individually substantially horizontally centered (e.g., in the X-direction and the Y-direction) over one of the lower contact structures 110. In additional embodiments, one or more of the sacrificial pillar structures 116 are individually horizontally offset (e.g., in the X-direction and/or in the Y-direction) from a horizontal center of the lower contact structure 110 associated therewith. For example, a horizontal center of at least one (e.g., all, less than all) of the sacrificial pillar structures 116 may be horizontally offset in the X-direction from a horizontal center of the lower contact structure 110 most proximate thereto. As another example, a horizontal center of at least one (e.g., all, less than all) of the sacrificial pillar structures 116 may be horizontally offset in the Y-direction from a horizontal center of the lower contact structure 110 most proximate thereto. If a horizontal center of an individual sacrificial pillar structure 116 is horizontally offset from a horizontal center of the lower contact structure 110 most proximate thereto, a portion of the sacrificial pillar structure 116 may still horizontally overlap a portion of the lower contact structure 110.

The sacrificial pillar structures 116 may each individually be formed to have a desired shape. By way of non-limiting example, the sacrificial pillar structures 116 may each be formed to exhibit a columnar (e.g., pillar) shape having circular cross-sectional shape, an oblong cross-sectional shape, a an elliptical cross-sectional shape, a square cross-sectional shape, a rectangular cross-sectional shape, a tear drop cross-sectional shape, a semicircular cross-sectional shape, a tombstone cross-sectional shape, a crescent cross-sectional shape, a triangular cross-sectional shape, a kite cross-sectional shape, or an irregular cross-sectional shape. In some embodiments, the sacrificial pillar structures 116 are each formed to have a circular column shape.

The sacrificial pillar structures 116 may each individually be formed to have desired dimensions (e.g., horizontal dimensions, vertical dimensions). As shown in FIG. 1F, in some embodiments, horizontal dimensions (e.g., diameters, widths, lengths) of individual sacrificial pillar structures 116 are substantially equal to horizontal dimensions of individual lower contact structures 110. A horizontal area of each of the sacrificial pillar structures 116 may be substantially equal to a horizontal area of each of the lower contact structures 110. In additional embodiments, horizontal dimensions of individual sacrificial pillar structures 116 in one or more directions (e.g., in the X-direction and/or the Y-direction) are different than horizontal dimensions of individual lower contact structures 110 in the one or more directions. By way of non-limiting example, horizontal dimensions of one or more (e.g., each) of the sacrificial pillar structures 116 in one or more directions (e.g., in the X-direction and/or the Y-direction) may be greater than horizontal dimensions of one or more (e.g., each) of the lower contact structures 110 in the one or more directions (e.g., in the X-direction and/or the Y-direction). A horizontal area of each of the sacrificial pillar structures 116 may be greater than a horizontal area of each of the lower contact structures 110. As another non-limiting example, horizontal dimensions of one or more (e.g., each) of the sacrificial pillar structures 116 in one or more directions (e.g., in the X-direction and/or the Y-direction) may be less than horizontal dimensions of one or more (e.g., each) of the lower contact structures 110 in the one or more directions (e.g., in the X-direction and/or the Y-direction). A horizontal area of each of the sacrificial pillar structures 116 may be less than a horizontal area of each of the lower contact structures 110. In addition, a vertical height of the sacrificial pillar structures 116 may be less than or equal to the vertical height $H_3$ of the sacrificial material 114 (FIG. 1E) employed to form the sacrificial pillar structures 116. As shown in FIG. 1F, in some embodiments, each of the sacrificial pillar structures 116 is formed to have substantially the same vertical height $H_3$ as the sacrificial material 114 (FIG. 1E).

Each of the sacrificial pillar structures 116 may be formed to have substantially the same geometric configuration (e.g., substantially the same shape, substantially the same dimensions) as each other of the sacrificial pillar structures 116, or at least one of the sacrificial pillar structures 116 may be formed to have a different geometric configuration (e.g., a different shape, at least one different dimension) than at least one other of the sacrificial pillar structures 116. In some embodiments, each of the sacrificial pillar structures 116 is formed to have substantially the same geometric configuration as each other of the sacrificial pillar structures 116.

The sacrificial pillar structures 116 and the trenches 118 may be formed using conventional processes (e.g., conventional material removal process, such as conventional photolithographic patterning processes and/or conventional etching processes) and conventional processing equipment, which are not described in detail herein. By way of non-limiting example, the sacrificial material 114 (FIG. 1E) may be subjected to at least one etching process (e.g., at least one anisotropic dry etching process, at least one anisotropic wet etching process) to form the sacrificial pillar structures 116 and the trenches 118.

With continued reference to FIG. 1F, the gate structures 120 may be formed horizontally adjacent the sacrificial pillar structures 116 within the trenches 118. As shown in FIG. 1F, in some embodiments, the gate structures 120 are formed directly horizontally adjacent the sacrificial pillar structures 116. As described in further detail below, in additional embodiments, the gate structures 120 are formed indirectly horizontally adjacent the sacrificial pillar structures 116. One or more additional features (e.g., additional materials, additional structures) may be formed to horizontally intervene between the gate structures 120 and the sacrificial pillar structures 116. By way of non-limiting example, gate dielectric structures may be formed to horizontally intervene between the gate structures 120 and the sacrificial pillar structures 116. As described in further detail below, the gate structures 120 may be configured and positioned relative to the sacrificial pillar structures 116 to facilitate one or more desirable transistor (e.g., vertical transistor) configurations through subsequent processing of the microelectronic device structure 100.

In some embodiments, the gate structures 120 are configured and positioned relative to the sacrificial pillar structures 116 to facilitate subsequent formation of so-called "double-gate" transistors individually including two (2) of the gate structures 120 horizontally neighboring two (2) opposing sides (e.g., in the X-direction) of a channel structure, as described in further detail below. For example, as shown in FIG. 1F, each of the trenches 118 horizontally interposed (e.g., in the X-direction) between two (2) horizontally neighboring (e.g., in the X-direction) sacrificial pillar structures 116 may include two (2) of the gate structures 120 structures therein.

In additional embodiments, the gate structures 120 are configured and positioned relative to the sacrificial pillar structures 116 to facilitate subsequent formation of so-called "single-gate" transistors individually including one (1) of the gate structures 120 horizontally neighboring a side of a channel structure, but not including another one (1) of the gate structures 120 horizontally neighboring an opposing side (e.g., in the X-direction) of the channel structure. For example, some of the trenches 118 horizontally interposed (e.g., in the X-direction) between horizontally neighboring (e.g., in the X-direction) sacrificial pillar structures 116 may individually include less than two (2) of the gate structures 120 structures therein. Some of the trenches 118 may include a single (e.g., only one) gate structure 120 therein, or may include no gate structures 120 therein (e.g., if a horizontally neighboring additional trench 118 includes two (2) of the gate structures 120 therein).

In further embodiments, the gate structures 120 are configured and positioned relative to the sacrificial pillar structures 116 to facilitate subsequent formation of so-called "tri-gate" transistors individually including at least one of the gate structures 120 horizontally neighboring three (3) sides (e.g., in the X-direction and in the Y-direction) of a channel structure, as described in further detail below. For example, for each of the sacrificial pillar structures 116, first portions of a single (e.g., only one) gate structure 120 may horizontally neighbor opposing sides (e.g., in the X-direction) of the sacrificial pillar structure 116; and a second portion of the gate structure 120 may horizontally extend from and between the first portions, and may horizontally neighbor another side (e.g., in the Y-direction) of the sacrificial pillar structure 116 horizontally interposed (e.g., in the X-direction) between the opposing sides of the sacrificial pillar structure 116.

In yet further embodiments, the gate structures 120 are configured and positioned relative to the sacrificial pillar structures 116 to facilitate subsequent formation of so-called "gate-all-around" transistors individually including at least one of the gate structures 120 horizontally neighboring all sides (e.g., in the X-direction and in the Y-direction) of a channel structure, as described in further detail below. For example, for each of the sacrificial pillar structures 116, portions of a single (e.g., only one) gate structure 120 may horizontally neighbor and substantially horizontally surround all sides (e.g., in the X-direction and the Y-direction) of the sacrificial pillar structure 116. First portions of the gate structure 120 may horizontally neighbor first opposing sides (e.g., in the X-direction) of the sacrificial pillar structure 116; and second portions of the gate structure 120 may horizontally extend from and between the first portions, and may horizontally neighbor second opposing sides (e.g., in the Y-direction) of the sacrificial pillar structure 116 horizontally interposed (e.g., in the X-direction) between the first opposing sides of the sacrificial pillar structure 116.

The gate structures 120 may be formed of and include at least one electrically conductive material, such as one or more of at least one metal (e.g., W, Ti, Mo, Nb, V, Hf, Ta, Cr, Zr, Fe, Ru, Os, Co, Rh, Jr, Ni, Pa, Pt, Cu, Ag, Au, Al), at least one alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), at least one conductively doped semiconductor material (e.g., conductively doped polysilicon, conductively doped Ge, conductively doped SiGe), and at least one conductive metal-containing material (e.g., a conductive metal nitride, a conductive metal silicide, a conductive metal carbide, a conductive metal oxide).

The gate structures 120 may each be substantially homogeneous, or one or more (e.g., each) of the gate structures 120 may be heterogeneous. If an individual gate structure 120 is heterogeneous, amounts of one or more elements included in the gate structure 120 may vary stepwise (e.g., change abruptly), or may vary continuously (e.g., change progressively, such as linearly, parabolically) throughout different portions of the gate structure 120. In some embodiments, each of the gate structures 120 is substantially homogeneous. In additional embodiments, one or more of the gate structures 120 is heterogeneous. One or more of the gate structures 120 may, for example, individually be formed of and include a stack of at least two different electrically conductive materials.

The gate structures 120 may each individually be formed to have desirable dimensions (e.g., horizontal dimensions, vertical dimensions). As a non-limiting example, one or more (e.g., each) of the gate structures 120 may individually be formed to have a horizontal width $W_1$ (e.g., in one or more directions horizontally extending away from one or more sides of the sacrificial pillar structures 116, such as in the X-direction shown in FIG. 1F) within a range of from about 5 nm to about 15 nm, such as from about 5 nm to about 10 nm, or from about 10 nm to about 15 nm. In some embodiments, the horizontal width $W_1$ of each of the gate structures 120 is formed to be within a range of from about 5 nm to about 10 nm. In addition, the gate structures 120 may each individually have a vertical height less than the vertical heights (e.g., the vertical height $H_3$) of the sacrificial pillar structures 116. As shown in FIG. 1F, lower vertical boundaries of the gate structures 120 may be substantially coplanar with lower vertical boundaries of the sacrificial pillar structures 116, and upper vertical boundaries of the gate structures 120 may be vertically offset from (e.g., vertically underlie) upper vertical boundaries of the sacrificial pillar structures 116.

The gate structures 120 may be formed within the trenches 118 using conventional processes and conventional processing equipment, which are not described in detail herein. By way of non-limiting example, at least one electrically conductive material may be conformally formed (e.g., deposited through one or more of a CVD process and an ALD process) over exposed surfaces of the microelectronic device structure 100 inside and outside of boundaries (e.g., horizontal boundaries, vertical boundaries) of the trenches 118; and then at least one etching process may be performed to remove portions of the microelectronic device structure 100 (e.g., from surfaces of the microelectronic device structure 100 outside of the trenches 118; from floors of at least some of the trenches 118; from upper portions of the sides of the sacrificial pillar structures 116) while at least partially maintaining additional portions (e.g., lower portions) of the electrically conductive material horizontally adjacent one or more sides of individual sacrificial pillar structures 116 to form the gate structures 120.

Figure 1G:
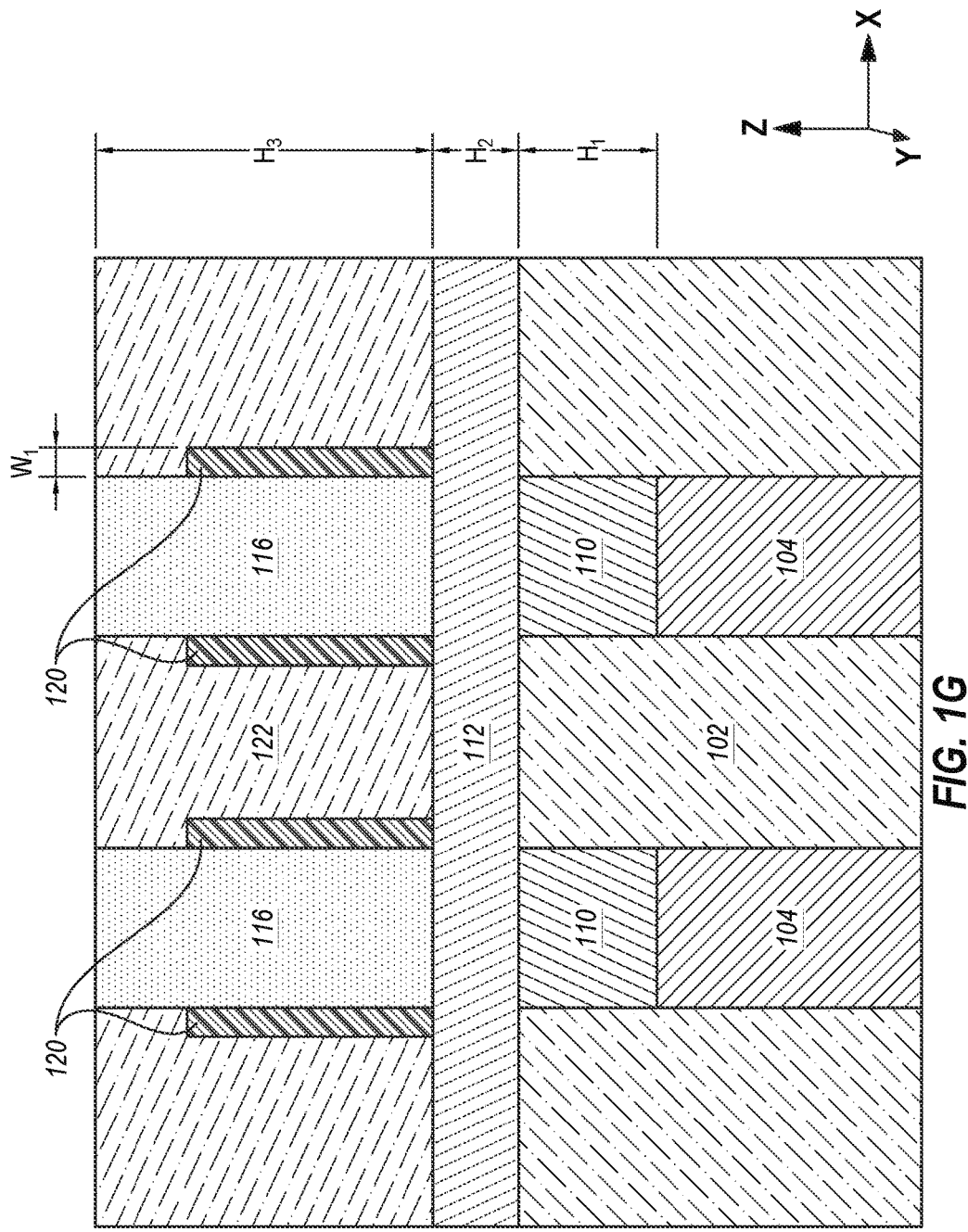

Referring next to FIG. 1G, remaining (e.g., unfilled) portions of the trenches 118 (FIG. 1F) may be filled (e.g., substantially filled) with a third isolation material 122. As shown in FIG. 1G, the third isolation material 122 may substantially surround and cover side surfaces (e.g., sidewalls) of the sacrificial pillar structures 116 and the gate structures 120 exposed within the trenches 118 (FIG. 1F) at the end of the processing stage previously described with reference to FIG. 1F. An upper vertical boundary of the third isolation material 122 may be formed to be substantially coplanar with upper vertical boundaries of the sacrificial pillar structures 116; and a lower vertical boundary of the third isolation material 122 may be formed to be substantially coplanar with lower vertical boundaries of the sacrificial pillar structures 116 and the gate structures 120.

The third isolation material 122 may be formed of and include at least one dielectric material having different etch selectivity than the sacrificial pillar structures 116, the second isolation material 112, and the gate structures 120. For example, the sacrificial pillar structures 116 may be selectively etchable relative to the third isolation material 122 during common (e.g., collective, mutual) exposure to a first etchant, and the third isolation material 122 may be selectively etchable relative to the sacrificial pillar structures 116 during common exposure to a second, different etchant. As another example, the second isolation material 112 may be selectively etchable relative to the third isolation material 122 during common (e.g., collective, mutual) exposure to a first etchant, and the third isolation material 122 may be selectively etchable relative to the second isolation material 112 during common exposure to a second, different etchant. The third isolation material 122 may, for example, be formed of and include one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and a $MgO_x$), at least one dielectric nitride material (e.g., $SiN_y$), at least one dielectric oxynitride material (e.g., $SiO_xN_y$), and at least one dielectric carboxynitride material (e.g., $SiO_xC_zN_y$). A material composition of the third isolation material 122 may be different than a material composition of the second isolation material 112, and may be substantially the same as or different than a material composition of the first isolation material 102. In some embodiments, such as some embodiments wherein the second isolation material 112 is formed of and includes $SiN_y$ (e.g., $Si_3N_4$), the third isolation material 122 is formed of and includes $SiO_x$ (e.g., $SiO_2$).

The third isolation material 122 may be substantially homogeneous, or the third isolation material 122 may be heterogeneous. If the third isolation material 122 is heterogeneous, amounts of one or more elements included in the third isolation material 122 may vary stepwise (e.g., change abruptly), or may vary continuously (e.g., change progressively, such as linearly, parabolically) throughout different portions of the third isolation material 122. In some embodiments, the third isolation material 122 is substantially homogeneous. In further embodiments, the third isolation material 122 is heterogeneous. The third isolation material 122 may, for example, be formed of and include a stack (e.g., laminate) of at least two different dielectric materials.

The third isolation material 122 may be formed using conventional processes (e.g., conventional deposition processes, such as one or more of spin-on coating, blanket coating, CVD, ALD, and PVD; conventional material removal processes, such as a conventional CMP process) and conventional processing equipment, which are not described in detail herein.

Figure 1H:
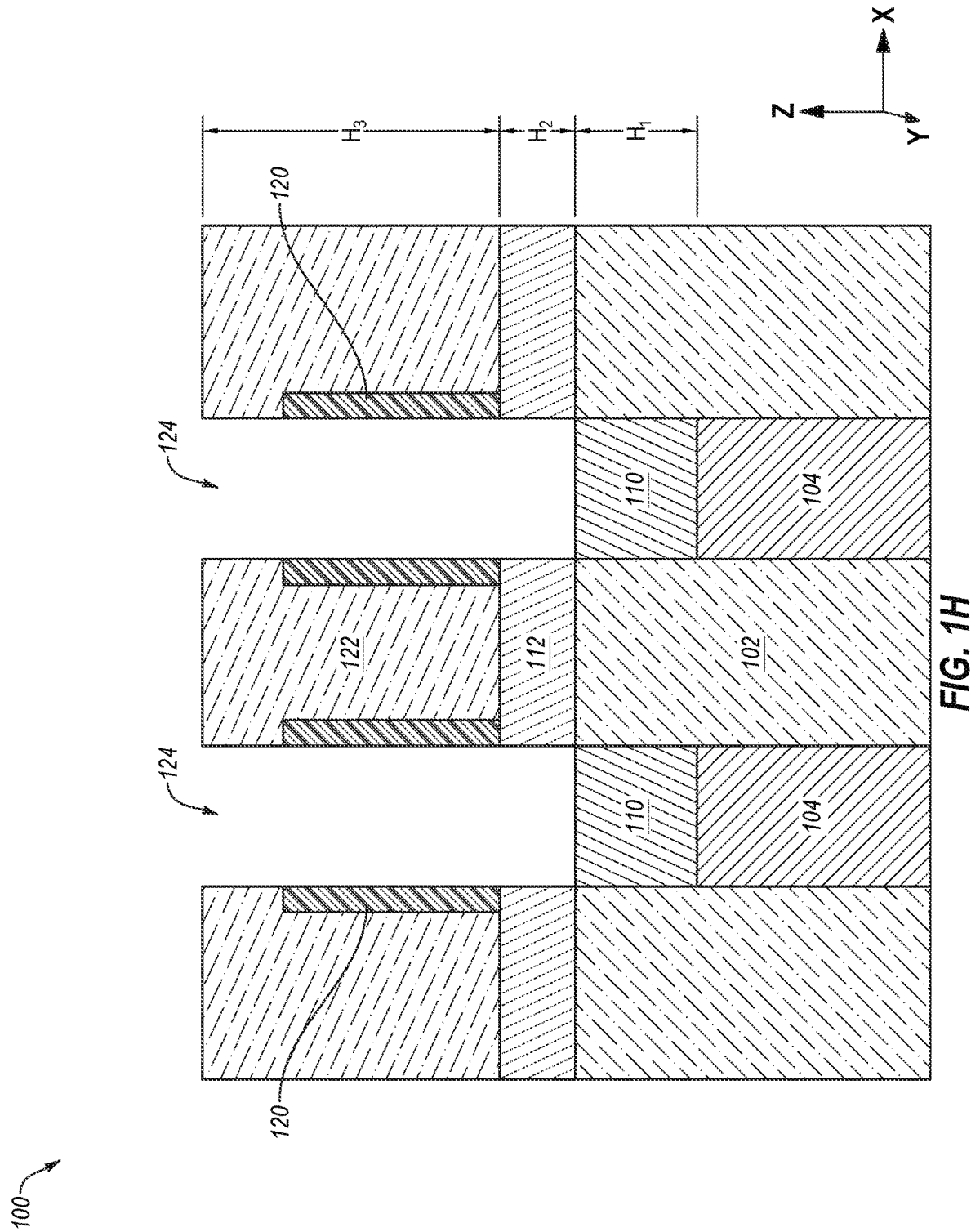

Referring next to FIG. 1H, the sacrificial pillar structures 116 (FIG. 1G) and portions of second isolation material 112 vertically thereunder may be selectively removed to form additional openings 124 (e.g., apertures, vias) vertically extending to the lower contact structures 110. Selective removal of the material of the sacrificial pillar structures 116 (FIG. 1G) and portions of second isolation material 112 vertically thereunder may facilitate subsequent formation of channel structures (e.g., vertical channel structures) for the microelectronic device structure 100 (e.g., through a damascene process) without having to subject material of the channel structures to one or more subtractive material removal (e.g., etching) processes that may otherwise negatively impact desired characteristics (e.g., current flow characteristics) of the channel structures, as described in further detail below.

As shown in FIG. 1H, the additional openings 124 may be located horizontally adjacent the gate structures 120. Horizontal boundaries of the additional openings 124 may be substantially the same as horizontal boundaries of the sacrificial pillar structures 116 (FIG. 1G). In addition, lower vertical boundaries of the additional openings 124 may be at least partially defined by (e.g., be substantially coplanar with) upper vertical boundaries (e.g., upper surfaces) of the lower contact structures 110. The additional openings 124 may vertically extend from upper vertical boundaries of the third isolation material 122 to the upper vertical boundaries of the lower contact structures 110. As shown in FIG. 1H, each of the additional openings 124 may have a vertical height $H_4$ corresponding to a combination (e.g., sum) of the vertical height $H_2$ of the second isolation material 112 and the vertical height $H_3$ of the third isolation material 122.

The sacrificial pillar structures 116 (FIG. 1G) and portions of the second isolation material 112 may be selectively removed relative to the other features of the microelectronic device structure 100 (e.g., the gate structures 120, the third isolation material 122, the lower contact structures 110, the first isolation material 102) using conventional material removal processes (e.g., conventional etching processes, such as one or more of a conventional wet etching process and a conventional dry etching process; conventional punching processes), which are not described in detail herein. For example, the sacrificial pillar structures 116 (FIG. 1G) may be selectively removed using a first material removal process (e.g., an etching process), and then portions of the second isolation material 112 exposed as a result of the removal of the sacrificial pillar structures 116 (FIG. 1G) may be selectively removed using a second material removal process (e.g., a punching process) to form the additional openings 124.

Figure 1I:
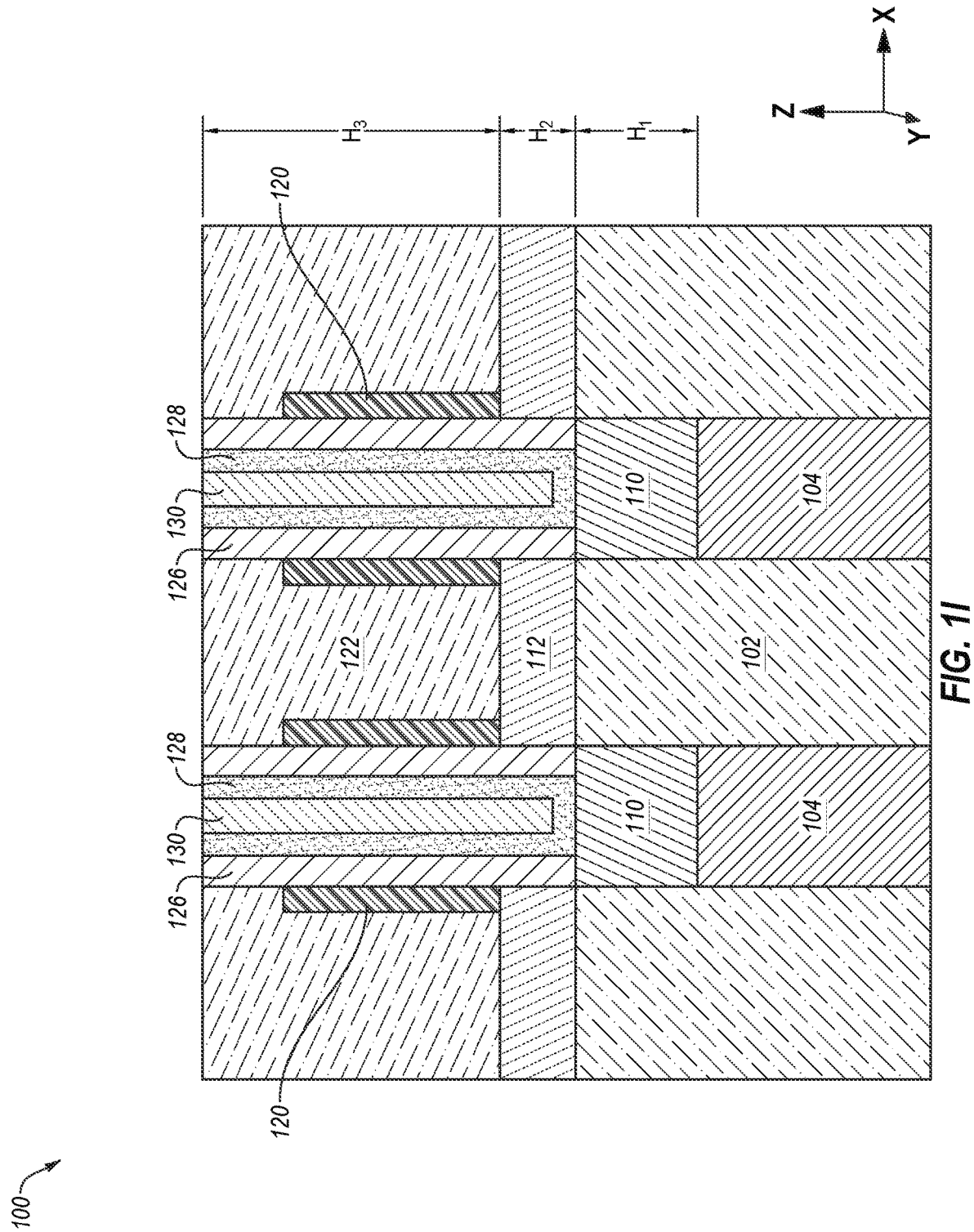

Referring next to FIG. 1I, gate dielectric structures 126, channel structures 128, and dielectric fill structures 130 may be formed within the additional openings 124 (FIG. 1H). The gate dielectric structures 126, the channel structures 128, and the dielectric fill structures 130 may collectively substantially fill the additional openings 124 (FIG. 1H). As shown in FIG. 1I, the gate dielectric structures 126 may be formed to horizontally intervene between the gate dielectric structures 126 and the channel structures 128, and the channel structures 128 may be formed to horizontally intervene between the gate dielectric structures 126 and the dielectric fill structures 130. Put another way, within horizontal boundaries of the additional openings 124 (FIG. 1H), the gate dielectric structures 126 may be formed horizontally inward of the gate structures 120, the channel structures 128 may be formed horizontally inward of the gate dielectric structures 126, and the dielectric fill structures 130 formed horizontally inward of the channel structures 128.

As shown in FIG. 1I, gate dielectric structures 126 may be formed to substantially cover side surfaces (e.g., sidewalls) of the third isolation material 122, the gate structures 120, and the second isolation material 112 exposed within the additional openings 124 (FIG. 1H) at the end of the processing stage previously described with reference to FIG. 1H. The gate dielectric structures 126 may be formed directly horizontally adjacent side surfaces (e.g., sidewalls) of the third isolation material 122, the gate structures 120, and the second isolation material 112 at horizontal boundaries of the additional openings 124 (FIG. 1H). In addition, the gate dielectric structures 126 may be formed to vertically extend (i.e., in the Z-direction) substantially completely through the additional openings 124 (FIG. 1H). For example, each of the gate dielectric structures 126 may individually vertically extend from an upper surface of the third isolation material 122 to an upper surface of one of the lower contact structures 110.

The gate dielectric structures 126 may be formed of and include at least one dielectric material, such as one or more of at least one oxide dielectric material (e.g., one or more of $SiO_x$, $AlO_x$, phosphosilicate glass, borosilicate glass, borophosphosilicate glass, fluorosilicate glass), at least one nitride dielectric material (e.g., $SiN_y$), at least one high-K dielectric material (e.g., one or more of zirconium oxide ($ZrO_x$); hafnium oxide ($HfO_x$); and a ternary high-K dielectric material, such as hafnium silicon oxide ($HfSi_xO_y$)), and at least one low-K dielectric material (e.g., one or more of silicon oxycarbide ($SiO_xC_y$), silicon oxynitride ($SiO_xN_y$), hydrogenated silicon oxycarbide ($SiC_xO_yH_z$), and silicon oxycarbonitride ($SiO_xC_zN_y$)). In some embodiments, the gate dielectric structures 126 are formed of and include $SiO_x$ (e.g., $SiO_2$).

The gate dielectric structures 126 may each be substantially homogeneous, or one or more (e.g., each) of the gate dielectric structures 126 may be heterogeneous. If an individual gate dielectric structure 126 is heterogeneous, amounts of one or more elements included in the gate dielectric structure 126 may vary stepwise (e.g., change abruptly), or may vary continuously (e.g., change progressively, such as linearly, parabolically) throughout different portions of the gate dielectric structure 126. In some embodiments, each of the gate dielectric structures 126 is substantially homogeneous. In additional embodiments, one or more of the gate dielectric structures 126 is heterogeneous. One or more of the gate dielectric structures 126 may, for example, individually be formed of and include a stack of at least two different dielectric materials.

The gate dielectric structures 126 may each individually be formed to have desirable horizontal dimensions. As a non-limiting example, one or more (e.g., each) of the gate structures 120 may individually be formed to have a horizontal width in one or more directions horizontally extending inward from horizontal boundaries of the additional openings 124 (FIG. 1H) (e.g., in the X-direction) within a range of from about 2 nm to about 20 nm, such as from about 2 nm to about 15 nm, or from about 2 nm to about 10 nm. In some embodiments, a horizontal width of each of the gate structures 120 is formed to be within a range of from about 2 nm to about 10 nm. In addition, as shown in FIG. 1I, each of the gate dielectric structures 126 may have substantially the same vertical height $H_4$ as the additional openings 124 (FIG. 1H).

While the gate dielectric structures 126 have been described herein as being formed during the processing stage being described with reference to FIG. 1I, the disclosure is not so limited. By way of non-limiting example, as previously discussed, in additional embodiments, the gate dielectric structures 126 are formed during the processing stage previously described with reference to FIG. 1F. The gate dielectric structures 126 may, for example, be formed horizontally between the sacrificial pillar structures 116 (FIG. 1F) and the gate structures 120. In such embodiments, the gate dielectric structures 126 may vertically terminate at an upper vertical boundary (e.g., an upper surface) of the second isolation material 112, rather than at upper vertical boundaries (e.g., upper surfaces) of the lower contact structures 110 as depicted in FIG. 1I. Put another way, the gate dielectric structures 126 may not be formed to vertically extend through the second isolation material 112. For example, the gate dielectric structures 126 may be formed to vertically extend from upper surfaces of the sacrificial pillar structures 116 (FIG. 1F) to an upper surface of the second isolation material 112. In addition, in such embodiments, horizontal positions of the gate dielectric structures 126 and the gate structures 120 and/or horizontal dimensions of the sacrificial pillar structures 116 (FIG. 1F) (and, hence, of the additional openings 124 (FIG. 1H)) may be modified as a result of the formation of the gate dielectric structures 126 during the processing stage previously described with reference to FIG. 1F.

Still referring to FIG. 1I, the channel structures 128 may be formed to substantially cover inner side surfaces (e.g., inner sidewalls) of the gate dielectric structures 126. The channel structures 128 may be formed directly horizontally adjacent the inner side surfaces (e.g., inner sidewalls) of the gate dielectric structures 126. In addition, the channel structures 128 may be formed to vertically extend (i.e., in the Z-direction) substantially completely through the additional openings 124 (FIG. 1H). For example, each of the channel structures 128 may individually vertically extend from an upper surface of the third isolation material 122 to an upper surface of one of the lower contact structures 110.

The channel structures 128 may each individually be formed to have a desired shape. As shown in FIG. 1I, in some embodiments, the channel structures 128 are individually configured such that the dielectric fill structures 130 vertically extend (i.e., in the Z-direction) only partially (e.g., less than completely) through the additional openings 124 (FIG. 1H). For example, for each of the channel structures 128, one of the dielectric fill structures 130 may be horizontally interposed between different horizontal portions of the channel structure 128 and may vertically terminate on the channel structure 128. Lower surfaces of the channel structures 128 may physically contact upper surfaces of the lower contact structures 110, and lower surfaces the dielectric fill structures 130 may physically contact horizontally extending surfaces of the channel structures 128. In additional embodiments, the channel structures 128 are individually configured such that the dielectric fill structures 130 vertically extend (i.e., in the Z-direction) substantially completely through the additional openings 124 (FIG. 1H). For example, for each of the channel structures 128, one of the dielectric fill structures 130 may be horizontally interposed between different horizontal portions of the channel structure 128, from an upper surface of the third isolation material 122 to an upper surface of one of the lower contact structures 110. Lower surfaces of the channel structures 128 may physically contact upper surfaces of the lower contact structures 110, and lower surfaces of the dielectric fill structures 130 may also physically contact the upper surfaces of lower contact structures 110.

The channel structures 128 may be formed of and include at least one oxide semiconductive material having a band gap larger than that polycrystalline silicon, such as a band gap larger than 1.65 electronvolts (eV). For example, the channel structures 128 may be formed of and include one or more of $Zn_xSn_yO$, $In_xZn_yO$, $Zn_xO$, $In_xGa_yZn_zO$, $In_xGa_ySi_zO$, $In_xW_yO$, $In_xO$, $Sn_xO$, $Ti_xO$, $Zn_xON_z$, $Mg_xZn_yO$, $Zr_xIn_yZn_zO$, $Hf_xIn_yZn_zO$, $Sn_xIn_yZn_zO$, $Al_xSn_yIn_zZn_aO$, $Si_xIn_yZn_zO$, $Al_xZn_ySn_zO$, $Ga_xZn_ySn_zO$, $Zr_xZn_ySn_zO$, and other similar materials. Formulae including at least one of "x," "y," "z," and "a" above (e.g., $Zn_xSn_yO$, $In_xZn_yO$, $In_xGa_yZn_zO$, $In_xW_yO$, $In_xGa_ySi_zO$, $Al_xSn_yIn_zZn_aO$) represent a composite material that contains, throughout one or more regions thereof, an average ratio of "x" atoms of one element, "y" atoms of another element (if any), "z" atoms of an additional element (if any), and "d" atoms of a further element (if any) for every one atom of oxygen (O). As the formulae are representative of relative atomic ratios and not strict chemical structure, the channel structures 128 may comprise one or more stoichiometric compounds and/or one or more non-stoichiometric compounds, and values of "x," "y," "z," and "a" may be integers or may be non-integers. In some embodiments, the channel structures 128 are formed of and include $In_xGa_yZn_zO$.

Oxide semiconductive material(s) of the channel structures 128 may be formed to have different (e.g., greater, lower) atomic concentration(s) of one or more elements (e.g., one or more metals, oxygen) than oxide semiconductive material(s) of the lower contact structures 110. By way of non-limiting example, the channel structures 128 may be formed to have deceased atomic concentration(s) of one or more metals (e.g., one or more of In, Sn, Zn, Ga, Mg, Ti, Al, Hf, and Zr) and/or metalloids (e.g., Si) and an increased atomic concentration of oxygen relative to the lower contact structures 110. Put another way, the channel structures 128 may be formed to be metal-lean and oxygen-rich relative to the lower contact structures 110. In some embodiments, such as embodiments wherein the lower contact structures 110 are formed to comprise an In-containing oxide semiconductor material (e.g., $In_xGa_yZn_zO$, $In_xO$), the channel structures 128 may be formed to include decreased atomic concentrations of In and/or increased atomic concentrations of oxygen as compared to the lower contact structures 110.

The channel structures 128 may individually be substantially homogeneous, or the channel structures 128 may individually be heterogeneous. If the channel structures 128 are individually heterogeneous, amounts of one or more elements included in an individual channel structure 128 may vary stepwise (e.g., change abruptly), or may vary continuously (e.g., change progressively, such as linearly, parabolically) throughout different regions of the channel structure 128. In some embodiments, the channel structures 128 are individually substantially homogeneous. In additional embodiments, the channel structures 128 are individually heterogeneous. In some embodiments, the channel structures 128 individually include substantially the same elements in all of the different regions thereof, but at least one region of an individual channel structure 128 includes a different atomic concentration of one or more of the elements than at least one other region of the channel structure 128. By way of non-limiting example, an individual channel structure 128 may be formed of and include a heterogeneous form of $In_xGa_yZn_zO$, such that each region of the channel structure 128 includes In, Ga, Zn, and O, but atomic concentration(s) of one or more of In, Ga, Zn, and O (e.g., In and/or O) in at least one region is/are different (e.g., relatively greater in In and/or relatively lower in O) than atomic concentration(s) of the one or more of In, Ga, Zn, and O (e.g., In and/or O) in at least one other region. In additional embodiments, the channel structures 128 individually include different elements in different regions thereof. An individual channel structure 128 may, for example, comprise a stack (e.g., laminate) of two or more (e.g., two, three, more than three) different oxide semiconductor materials.

The channel structures 128 may each individually be formed to have desirable horizontal dimensions. As a non-limiting example, one or more (e.g., each) of the channel structures 128 may individually be formed to have a horizontal width in one or more directions horizontally extending inward from inner horizontal boundaries (e.g., inner side surfaces) of individual gate dielectric structures 126 (e.g., in the X-direction) within a range of from about 5 nm to about 30 nm. In addition, as shown in FIG. 1I, each of the channel structures 128 may have substantially the same vertical height $H_4$ as the additional openings 124 (FIG. 1H).

With continued reference to FIG. 1I, the dielectric fill structures 130 may be formed to substantially fill remaining portions of the additional openings 124 (FIG. 1H) unoccupied by the gate dielectric structures 126 and the channel structures 128. The dielectric fill structures 130 may be formed to substantially cover inner side surfaces (e.g., inner sidewalls) of the channel structures 128. The dielectric fill structures 130 may be formed directly horizontally adjacent the inner side surfaces (e.g., inner sidewalls) of the channel structures 128. As shown in FIG. 1I, the dielectric fill structures 130 may be formed to vertically extend (i.e., in the Z-direction) from an upper vertical boundary (e.g., an upper surface) of the third isolation material 122 toward upper vertical boundaries (e.g., upper surfaces) of the lower contact structures 110. The dielectric fill structures 130 may enhance the structural stability and reliability of the channel structures 128 (and, hence, of vertical transistors including the channel structures 128), and may also facilitate the formation of upper contact structures having relatively large contact surface areas (as compared to conventional upper contact structure configurations) for contact with the channel structures 128, as described in further detail below.

The dielectric fill structures 130 may individually be formed of and include at least one dielectric material having different etch selectivity than the channel structures 128, the gate dielectric structures 126, and the third isolation material 122. For example, the dielectric fill structures 130 may be selectively etchable relative to the channel structures 128, the gate dielectric structures 126, and the third isolation material 122 during common (e.g., collective, mutual) exposure to a selected etchant. The dielectric fill structures 130 may, for example, be formed of and include one or more of at least one dielectric oxide material (e.g., one or more of yttrium oxide ($YO_x$), $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and a $MgO_x$), at least one dielectric nitride material (e.g., $SiN_y$), at least one dielectric oxynitride material (e.g., $SiO_xN_y$), and at least one dielectric carboxynitride material (e.g., $SiO_xC_zN_y$). A material composition of the dielectric fill structures 130 may be different than material compositions of the third isolation material 122 and the gate dielectric structures 126, and may be substantially the same as or different than a material composition of the second isolation material 112. In some embodiments, such as some embodiments wherein one or more of the third isolation material 122 and the gate dielectric structures 126 are formed of and include $SiO_x$ (e.g., $SiO_2$), the dielectric fill structures 130 are individually formed of and include $SiN_y$ (e.g., $Si_3N_4$). In additional embodiments, the dielectric fill structures 130 are individually formed of and include $YO_x$ (e.g., yttrium (III) oxide ($Y_2O_3$)).

The dielectric fill structures 130 may each be substantially homogeneous, or one or more (e.g., each) of the dielectric fill structures 130 may be heterogeneous. If an individual dielectric fill structure 130 is heterogeneous, amounts of one or more elements included in the dielectric fill structure 130 may vary stepwise (e.g., change abruptly), or may vary continuously (e.g., change progressively, such as linearly, parabolically) throughout different portions of the dielectric fill structure 130. In some embodiments, each of the dielectric fill structures 130 is substantially homogeneous. In additional embodiments, one or more of the dielectric fill structures 130 is heterogeneous. One or more of the dielectric fill structures 130 may, for example, individually be formed of and include a stack of at least two different dielectric materials.

The gate dielectric structures 126, the channel structures 128, and the dielectric fill structures 130 may be formed using conventional processes (e.g., conventional deposition processes, such as one or more of ALD, CVD, and PVD; conventional material removal processes, such as one or more of anisotropic etching and CMP) and conventional processing equipment, which are not described in detail herein.

Figure 1J:
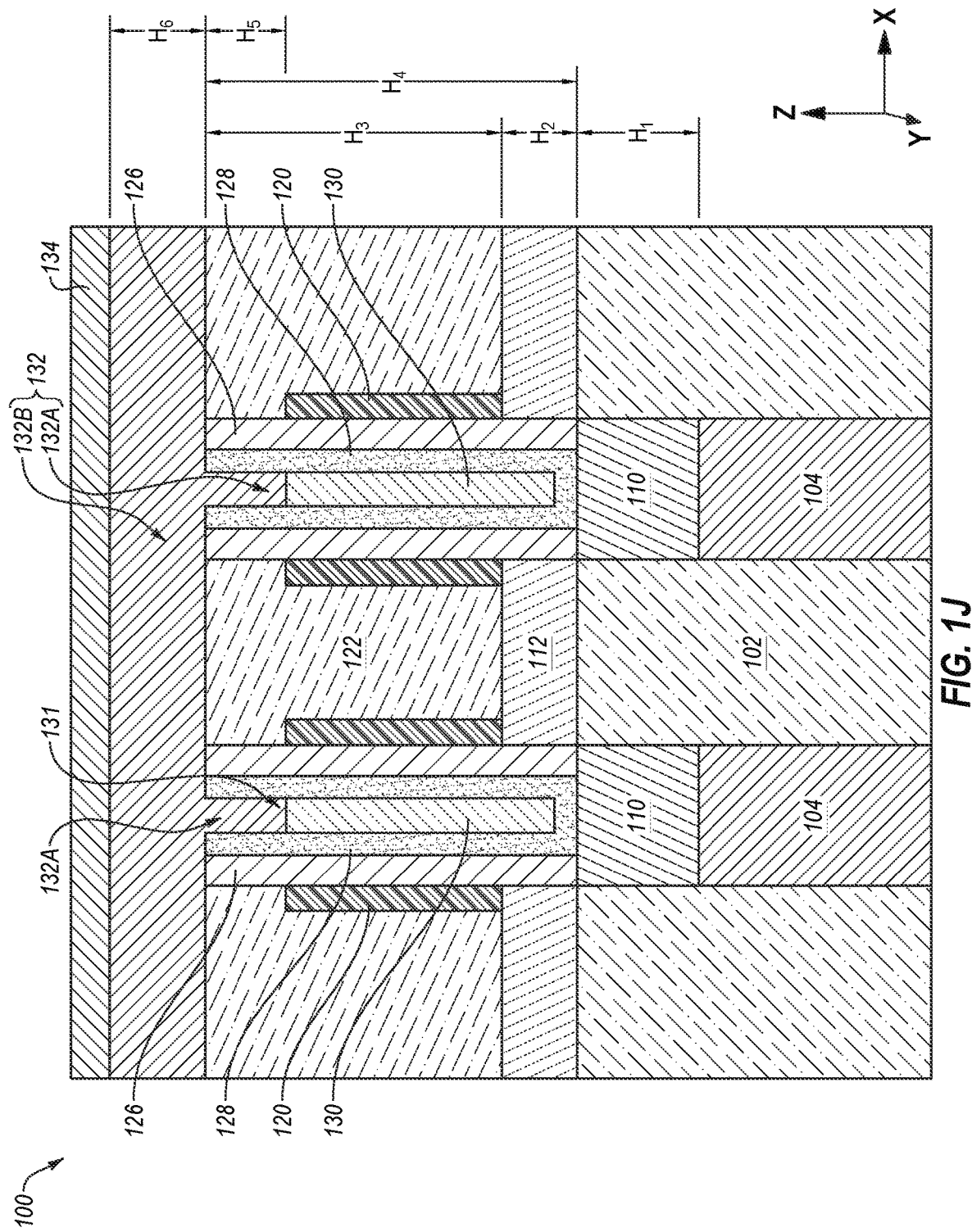

Referring next to FIG. 1J, the dielectric fill structures 130 may be vertically recessed (e.g., upper portions of the dielectric fill structures 130 may be removed) relative to the channel structures 128, the gate dielectric structures 126, and the third isolation material 122; an upper contact material 132 may be formed to fill the resulting recesses and cover upper surfaces of the channel structures 128, the gate dielectric structures 126, and the third isolation material 122; and a upper conductive material 134 may be formed on or over the upper contact material 132.

As shown in FIG. 1J, recessed upper surfaces 131 of the dielectric fill structures 130 may be vertically offset from upper surfaces of the channel structures 128, the gate dielectric structures 126, and the third isolation material 122 by a vertical height $H_5$ (e.g., vertically depth) having a magnitude within a range of from 5 nanometers (nm) to about 100 nm. The recessed upper surfaces 131 of the dielectric fill structures 130 may be vertically positioned (e.g., in the Z-direction) below, at, or above upper surfaces of the gate structures 120. In some embodiments, the recessed upper surfaces 131 of the dielectric fill structures 130 are formed to be substantially coplanar with the upper surfaces of the gate structures 120. In additional embodiments, the recessed upper surfaces 131 of the dielectric fill structures 130 are formed to be positioned vertically below the upper surfaces of the gate structures 120.

With continued reference to FIG. 1J, the upper contact material 132 may be formed to substantially fill recesses resulting from the selective removal of upper portions of the dielectric fill structures 130. For example, as shown in FIG. 1J, the upper contact material 132 may be formed to include first portions 132A (e.g., vertically projecting portions) vertically extending (e.g., in the Z-direction) into and substantially filling the recesses; and a second portion 132B integral and continuous with the first portions 132A and horizontally extending (e.g., in the X-direction and the Y-direction) across upper surfaces of the channel structures 128, the gate dielectric structures 126, and the third isolation material 122 outside of the recesses. As depicted in FIG. 1J, the upper contact material 132 may have a non-planar lower vertical boundary, and a substantially planar upper vertical boundary.

The first portions 132A of the upper contact material 132 may substantially cover the recessed upper surfaces 131 of the dielectric fill structures 130 and upper portions of inner side surfaces of the channel structures 128. The first portions 132A of the upper contact material 132 may be formed directly vertically adjacent (e.g., vertically on) the recessed upper surfaces 131 of the dielectric fill structures 130, and directly horizontally adjacent (e.g., horizontally on) the upper portions of the inner side surfaces of the channel structures 128. In addition, the second portion 132B of the upper contact material 132 may substantially cover the upper surfaces of the channel structures 128, the gate dielectric structures 126, and the third isolation material 122. The second portion 132B of the upper contact material 132 may be formed directly vertically adjacent (e.g., vertically on) the upper surfaces of the channel structures 128, the gate dielectric structures 126, and the third isolation material 122.

As shown in FIG. 1J, the first portions 132A of the upper contact material 132 may be formed to have substantially the same vertical height $H_5$ as the recesses formed by the selective removal of the upper portions of the dielectric fill structures 130. In addition, the second portion 132B of the upper contact material 132 may have a desired vertical height $H_6$. By way of non-limiting example, the vertical height $H_6$ of the second portion 132B of the upper contact material 132 may be within a range of from about 5 nm to about 50 nm.

The upper contact material 132 (including the first portions 132A and the second portion 132B thereof) may be formed of and include at least one oxide semiconductive material. For example, the upper contact material 132 may be formed of and include one or more of $Zn_xSn_yO$, $In_xZn_yO$, $Zn_xO$, $In_xGa_yZn_zO$, $In_xGa_ySi_zO$, $In_xW_yO$, $In_xO$, $Sn_xO$, $Ti_xO$, $Zn_xON_z$, $Mg_xZn_yO$, $Zr_xIn_yZn_zO$, $Hf_xIn_yZn_zO$, $Sn_xIn_yZn_zO$, $Al_xSn_yIn_zZn_aO$, $Si_xIn_yZn_zO$, $Al_xZn_ySn_zO$, $Ga_xZn_ySn_zO$, $Zr_xZn_ySn_zO$, and other similar materials. Formulae including at least one of "x," "y," "z," and "a" above (e.g., $Zn_xSn_yO$, $In_xZn_yO$, $In_xGa_yZn_zO$, $In_xW_yO$, $In_xGa_ySi_zO$, $Al_xSn_yIn_zZn_aO$) represent a composite material that contains, throughout one or more regions thereof, an average ratio of "x" atoms of one element, "y" atoms of another element (if any), "z" atoms of an additional element (if any), and "d" atoms of a further element (if any) for every one atom of oxygen (O). As the formulae are representative of relative atomic ratios and not strict chemical structure, the upper contact material 132 may comprise one or more stoichiometric compounds and/or one or more non-stoichiometric compounds, and values of "x," "y," "z," and "a" may be integers or may be non-integers. In some embodiments, the upper contact material 132 is formed of and includes one or more of $In_xGa_yZn_zO$ and $In_xO$ (e.g., indium (III) oxide, $In_2O_3$).

Oxide semiconductive material(s) of the upper contact material 132 may be formed to have different (e.g., greater, lower) atomic concentration(s) of one or more elements (e.g., one or more metals, oxygen) than oxide semiconductive material(s) of the channel structures 128. By way of non-limiting example, the upper contact material 132 may be formed to have increased atomic concentration(s) of one or more metals (e.g., one or more of In, Sn, Zn, Ga, Mg, Ti, Al, and Zr) and/or metalloids (e.g., Si) and a decreased atomic concentration of oxygen relative to the channel structures 128. Put another way, the upper contact material 132 may be formed to be metal-rich and oxygen-lean relative to the channel structures 128. In some embodiments, such as embodiments wherein the channel structures 128 are formed to comprise an In-containing oxide semiconductor material, the upper contact material 132 may be formed to include increased atomic concentrations of In and/or decreased atomic concentrations of oxygen as compared to the channel structures 128.

A material composition of the upper contact material 132 may be substantially the same as a material composition of the lower contact structures 110 (and, hence, of the lower contact material 108 (FIG. 1C)), or the material composition of the upper contact material 132 may be different than the material composition of the lower contact structures 110 (and, hence, of the lower contact material 108 (FIG. 1C)). In some embodiments, the material composition of the upper contact material 132 is substantially the same as the material composition of the lower contact structures 110.

The upper contact material 132 may be substantially homogeneous, or the upper contact material 132 may be heterogeneous. If the upper contact material 132 is heterogeneous, amounts of one or more elements included in the upper contact material 132 may vary stepwise (e.g., change abruptly), or may vary continuously (e.g., change progressively, such as linearly, parabolically) throughout different regions of the upper contact material 132. In some embodiments, the upper contact material 132 is substantially homogeneous. In additional embodiments, the upper contact material 132 is heterogeneous. Relatively vertically higher (e.g., in the Z-direction) regions of the upper contact material 132 may, for example, be relatively metal-rich (e.g., In-rich) and oxygen-lean as compared to relatively vertically lower regions of the upper contact material 132. In some embodiments, the upper contact material 132 includes substantially the same elements in all of the different vertical regions thereof, but at least one relatively vertically higher region of the upper contact material 132 includes a different atomic concentration of one or more of the elements than at least one relatively vertically lower region of the upper contact material 132. By way of non-limiting example, the upper contact material 132 may comprise a heterogeneous form of $In_xGa_yZn_zO$, such that each vertical region of the upper contact material 132 includes In, Ga, Zn, and O, but atomic concentration(s) of one or more of In, Ga, Zn, and O (e.g., In and/or O) in at least one relatively vertically higher region is/are different (e.g., relatively greater in In and/or relatively lower in O) than atomic concentration(s) of the one or more of In, Ga, Zn, and O (e.g., In and/or O) in at least one relatively vertically lower region. In additional embodiments, the upper contact material 132 includes different elements in at least one of the different vertical regions thereof than in at least one other of the different vertical regions thereof. The upper contact material 132 may, for example, comprise a stack (e.g., laminate) of two or more (e.g., two, three, more than three) different oxide semiconductor materials. In some such embodiments, a first oxide semiconductor material positioned relatively vertically higher (e.g., in the Z-direction) within the upper contact material 132 may be metal-rich (e.g., In-rich) and/or oxygen-lean relative to a second oxide semiconductor material positioned relatively vertically lower within the upper contact material 132.

Still referring to FIG. 1J, the upper conductive material 134 may be formed on or over an upper surface of the upper contact material 132. The upper conductive material 134 may be formed of and include at least one electrically conductive material, such as one or more of at least one metal (e.g., W, Ti, Mo, Nb, V, Hf, Ta, Cr, Zr, Fe, Ru, Os, Co, Rh, Ir, Ni, Pa, Pt, Cu, Ag, Au, Al), at least one alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), at least one conductively doped semiconductor material (e.g., conductively doped polysilicon, conductively doped Ge, conductively doped SiGe), and at least one conductive metal-containing material (e.g., a conductive metal nitride, a conductive metal silicide, a conductive metal carbide, a conductive metal oxide). A material composition of the upper conductive material 134 may be substantially the same as a material composition of the lower conductive structures 104, or the material composition of the upper conductive material 134 may be different than the material composition of the lower conductive structures 104. In some embodiments, the upper conductive material 134 is formed of and includes W.

The upper conductive material 134 may be substantially homogeneous, or the upper conductive material 134 may be heterogeneous. If the upper conductive material 134 is heterogeneous, amounts of one or more elements included in the upper conductive material 134 may vary stepwise (e.g., change abruptly), or may vary continuously (e.g., change progressively, such as linearly, parabolically) throughout different portions of the upper conductive material 134. In some embodiments, the upper conductive material 134 is substantially homogeneous. In further embodiments, the upper conductive material 134 is heterogeneous. The upper conductive material 134 may, for example, be formed of and include a stack (e.g., laminate) of at least two different electrically conductive materials.

The dielectric fill structures 130 may be vertically recessed, and the upper contact material 132 and the upper conductive material 134 may be formed using conventional processes, which are not described in detail herein. By way of non-limiting example, upper portions of the dielectric fill structures 130 may be selectively removed by treating (e.g., through one or more of a spin-coating process, a spray-coating process, an immersion-coating process, a vapor-coating process, and a soaking process) the microelectronic device structure 100 following the processing stage previously described with reference to FIG. 1I with at least one etchant (e.g., at least one wet etchant) formulated to selectively remove exposed portions of the dielectric fill structures 130 without substantially removing exposed portions of the channel structures 128, the gate dielectric structures 126, and the third isolation material 122. Thereafter, the upper contact material 132 and the conductive material may be formed through one or more conventional deposition processes (e.g., one or more of ALD, CVD, and PVD).

Referring next to FIG. 1K, sections (e.g., regions, portions) of the upper contact material 132 and the upper conductive material 134 may be removed to form upper contact structures 136 and upper conductive structures 138, respectively. The upper contact structures 136 may individually include first portions 136A corresponding to the first portions 132A of the upper contact material 132, and second portions 136B corresponding to additional sections of the second portion 132B of the upper contact material 132 remaining after the material removal process. The second portions 136B of the upper contact structures 136 may be integral and continuous with the first portions 136A of the upper contact structures 136. In addition, the upper conductive structures 138 contact (e.g., physically contact, electrically contact) the upper contact structures 136, and correspond to additional sections of the upper conductive material 134 remaining after the material removal process.

As shown in FIG. 1K, the first portions 136A of the upper contact structures 136 may be positioned directly vertically adjacent (e.g., vertically on) the recessed upper surfaces 131 of the dielectric fill structures 130, and directly horizontally adjacent (e.g., horizontally on) upper portions of the inner side surfaces of the channel structures 128. In addition, the second portions 136B of the upper contact structures 136 may cover (e.g., substantially cover) and contact (e.g., physically contact, electrically contact) upper surfaces of at least the channel structures 128. The second portions 136B of the upper contact structures 136 may be formed to have desirable horizontal dimensions (e.g., in the X-direction, and the in Y-direction). As shown in FIG. 1K, in some embodiments, the second portions 136B of the upper contact structures 136 cover and physically contact upper surfaces of the channel structures 128 and the gate dielectric structures 126. In additional embodiments, the second portions 136B of the upper contact structures 136 cover and physically contact upper surfaces of the channel structures 128 and the gate dielectric structures 126, as well as portions of the upper surface of the third isolation material 122.

The first portion 136A of each upper contact structure 136 may enhance the surface area of the upper contact structure 136 contacting one of the channel structures 128 relative to conventional upper contact structure configurations not including first portions 136A, such as conventional configurations wherein an upper contact structure exhibits a substantially planar lower surface that only contact an upper surface of a channel structure. The relatively enhanced contact surface area of the upper contact structure 136 may improve electrical on-state properties of a device (e.g., a transistor) including the upper contact structure 136 relative to conventional device (e.g., conventional transistor) configurations not including the upper contact structure 136.

With continued reference to FIG. 1K, the gate structures 120, the gate dielectric structures 126, the channel structures 128, the dielectric fill structure 130, the lower contact structures 110, and the upper contact structures 136 (including the first portions 136A and the second portions 136B thereof) of the microelectronic device structure 100 may form multiple vertical transistors 140 (e.g., vertical thin film transistors (TFTs)). The vertical transistors 140 may, for example, be employed as driver transistors (e.g., string driver transistors) for a microelectronic device including the microelectronic device structure 100, as described in further detail. Each of the vertical transistors 140 may individually include a lower contact structure 110, at least one gate structure 120, a gate dielectric structure 126, a channel structure 128, a dielectric fill structure 130, and an upper contact structure 136. As previously described with reference to FIG. 1F, depending on the configurations of the gate structures 120, the vertical transistors 140 may each individually have "double-gate" design, a "single-gate" design, a "tri-gate" design, or a "gate-all-around" design.

Still referring to FIG. 1K, the upper conductive structures 138 may be formed to have desired geometric configurations (e.g., shapes, dimensions). The geometric configurations of the upper conductive structures 138 at least partially depend on desired functions of the upper conductive structures 138. In some embodiments, the upper conductive structures 138 are employed as conductive routing structures (e.g., metallization level structures) for control logic circuitry (e.g., complementary metal oxide semiconductor (CMOS) circuitry) of control logic devices (e.g., string drivers) including the vertical transistors 140.

The upper contact structures 136 may respectively be formed from the upper contact material 132 (FIG. 1J) and the upper conductive material 134 (FIG. 1J) using conventional processes (e.g., conventional photolithographic patterning processes, conventional etching processes) and conventional processing equipment, which are not described in detail herein.

Thus, in accordance with embodiments of the disclosure, a method of forming a microelectronic device comprises forming lower contact structures comprising a first oxide semiconductive material on conductive structures vertically extending through a first isolation material. A second isolation material is formed on the first isolation material and the lower contact structures. Gate structures are formed on the second isolation material. Channel structures are formed to horizontally neighbor the gate structures and to vertically extend through the second isolation material to the lower contact structures. The channel structures comprise a second oxide semiconductive material. Dielectric structures are formed to horizontally neighbor the channel structures and to have upper surfaces vertically recessed relative to upper surfaces of the channel structures. Upper contact structures comprising a third oxide semiconductive material are formed on the channel structures and the dielectric structures.

Furthermore, in accordance with additional embodiments of the disclosure, a transistor comprises a lower contact structure, a channel structure, a dielectric fill structure, and an upper contact structure. The lower contact structure comprises a first oxide semiconductive material. The channel structure is in physical contact with the lower contact structure and comprises a second oxide semiconductive material having a smaller atomic concentration of one or more metals than an atomic concentration of the one or more metals in the first oxide semiconductive material. The dielectric fill structure is in physical contact with an inner side surface the channel structure and has an upper surface vertically recessed relative to an upper surface of the channel structure. The upper contact structure comprises a third oxide semiconductive material having a relatively greater atomic concentration of the one or more metals than the atomic concentration of the one or more metals in the channel structure. The upper contact structure comprises a first portion in physical contact with the upper surface of the dielectric fill structure and the inner side surface of the channel structure, and a second portion in physical contact with the upper surface of the channel structure.

Figure 2:
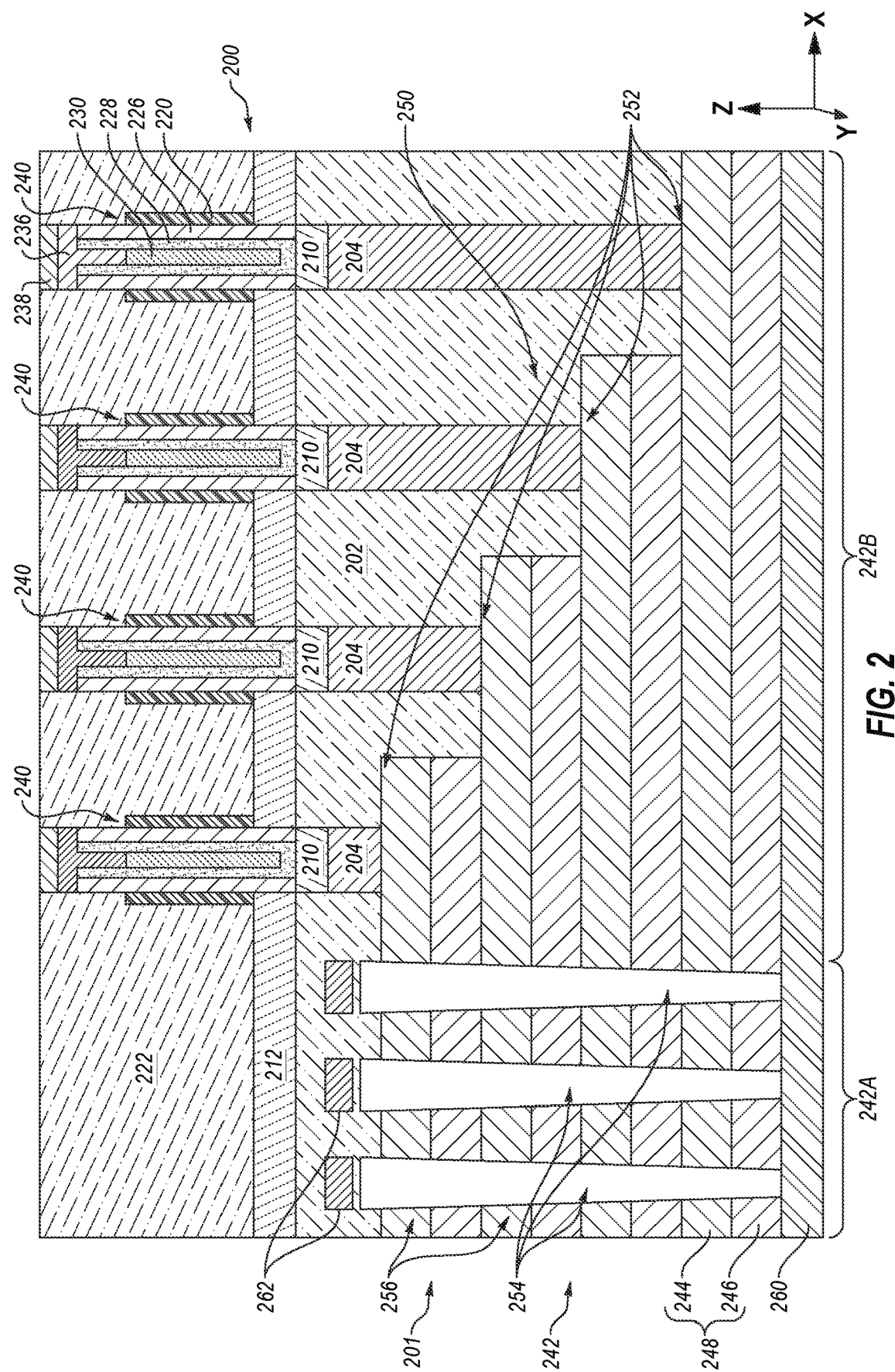
FIG. 2 is a partial cutaway perspective view of a microelectronic device, in accordance with embodiments of the disclosure.

Microelectronic device structures (e.g., the microelectronic device structure 100 following processing stage previously described with reference to FIG. 1K) according to embodiments of the disclosure may be included in microelectronic devices (e.g., memory devices, such as 3D NAND Flash memory devices) of the disclosure. For example, FIG. 2 illustrates a simplified, partial cross-sectional view of a microelectronic device 201 including a microelectronic device structure 200. The microelectronic device structure 200 may be substantially similar to the microelectronic device structure 100 following processing stage previously described with reference to FIG. 1K. Throughout FIG. 2 and the associated description below, features (e.g., structures, materials, regions) functionally similar to features of the microelectronic device structure 100 previously described with reference to one or more of FIGS. 1A through 1K are referred to with similar reference numerals incremented by 100. To avoid repetition, not all features shown in FIG. 2 are described in detail herein. Rather, unless described otherwise below, in FIG. 2, a feature designated by a reference numeral that is a 100 increment of the reference numeral of a feature previously described with reference to one or more of FIGS. 1A through 1K will be understood to be substantially similar to and formed in substantially the same manner as the previously described feature.

As shown in FIG. 2, the microelectronic device structure 200 (including the components thereof previously described with reference to one or more of FIGS. 1A through 1K) of the microelectronic device 201 may vertically overlie (e.g., in the Z-direction) and be operatively associated with a stack structure 242 of the microelectronic device 201. The stack structure 242 includes a vertically alternating (e.g., in the Z-direction) sequence of conductive structures 244 (e.g., access line plates, word line plates) and insulative structures 246 arranged in tiers 248. In addition, as shown in FIG. 2, the stack structure 242 includes a memory array region 242A, and a staircase region 242B horizontally neighboring (e.g., in the X-direction) the memory array region 242A. As described in further detail below, the microelectronic device 201 further includes additional components (e.g., features, structures, devices) within horizontal boundaries of the different regions (e.g., the memory array region 242A and the staircase region 242B) of the stack structure 242.

The tiers 248 of the stack structure 242 of the microelectronic device 201 may each individually include at least one of the conductive structures 244 vertically neighboring at least one of the insulative structures 246. The stack structure 242 may include a desired quantity of the tiers 248. For example, the stack structure 242 may include greater than or equal to eight (8) of the tiers 248, greater than or equal to sixteen (16) of the tiers 248, greater than or equal to thirty-two (32) of the tiers 248, greater than or equal to sixty-four (64) of the tiers 248, greater than or equal to one hundred and twenty-eight (128) of the tiers 248, or greater than or equal to two hundred and fifty-six (256) of the tiers 248 of the conductive structures 244 and the insulative structures 246.

The conductive structures 244 of the tiers 248 of the stack structure 242 may be formed of and include at least one electrically conductive material, such as one or more of at least one metal (e.g., W, Ti, Mo, Nb, V, Hf, Ta, Cr, Zr, Fe, Ru, Os, Co, Rh, Ir, Ni, Pa, Pt, Cu, Ag, Au, Al), at least one alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), at least one conductively doped semiconductor material (e.g., conductively doped polysilicon, conductively doped Ge, conductively doped SiGe), and at least one conductive metal-containing material (e.g., a conductive metal nitride, a conductive metal silicide, a conductive metal carbide, a conductive metal oxide). In some embodiments, the conductive structures 244 are formed of and include a metallic material (e.g., a metal, such as W; an alloy). In additional embodiments, the conductive structures 244 are formed of and include conductively doped polysilicon. Each of the conductive structures 244 may individually be substantially homogeneous, or one or more of the conductive structures 244 may individually be substantially heterogeneous. In some embodiments, each of the conductive structures 244 of the stack structure 242 is substantially homogeneous. In additional embodiments, at least one (e.g., each) of the conductive structures 244 of the stack structure 242 is heterogeneous. An individual conductive structure 244 may, for example, be formed of and include a stack of at least two different electrically conductive materials. The conductive structures 244 of each of the tiers 248 of the stack structure 242 may each be substantially planar, and may each exhibit a desired thickness.

The insulative structures 246 of the tiers 248 of the stack structure 242 may be formed of and include at least one dielectric material, such as one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), and at least one dielectric carboxynitride material (e.g., $SiO_xC_zN_y$). In some embodiments, the insulative structures 246 are formed of and include $SiO_2$. Each of the insulative structures 246 may individually be substantially homogeneous, or one or more of the insulative structures 246 may individually be substantially heterogeneous. In some embodiments, each of the insulative structures 246 of the stack structure 242 is substantially homogeneous. In additional embodiments, at least one (e.g., each) of the insulative structures 246 of the stack structure 242 is heterogeneous. An individual insulative structures 246 may, for example, be formed of and include a stack of at least two different dielectric materials. The insulative structures 246 of each of the tiers 248 of the stack structure 242 may each be substantially planar, and may each individually exhibit a desired thickness.

At least one lower conductive structure 244 of the stack structure 242 may be employed as at least one lower select gate (e.g., at least one source side select gate (SGS)) of the microelectronic device 201. In some embodiments, a single (e.g., only one) conductive structure 244 of a vertically lowermost tier 248 of the stack structure 242 is employed as a lower select gate (e.g., a SGS) of the microelectronic device 201. In addition, upper conductive structure(s) 244 of the stack structure 242 may be employed as upper select gate(s) (e.g., drain side select gate(s) (SGDs)) of the microelectronic device 201. In some embodiments, horizontally neighboring (e.g., in the Y-direction) conductive structures 244 of a vertically uppermost tier 248 of the stack structure 242 are employed as upper select gates (e.g., SGDs) of the microelectronic device 201.

Still referring to FIG. 2, within horizontal boundaries (e.g., in the X-direction and the Y-direction) of the memory array region 242A of the stack structure 242, the microelectronic device 201 may include pillar structures 254 vertically extending through the stack structure 242. Each of the pillar structures 254 may include a semiconductive pillar (e.g., a polysilicon pillar, a silicon-germanium pillar) at least partially surrounded by one or more charge storage structures (e.g., a charge trapping structure, such as a charge trapping structure comprising an oxide-nitride-oxide ("ONO") material; floating gate structures). Intersections of the pillar structures 254 and the conductive structures 244 of the tiers 248 of the stack structure 242 may define vertically extending strings of memory cells 256 coupled in series with one another within the memory array region 242A of the stack structure 242. In some embodiments, the memory cells 256 formed at the intersections of the conductive structures 244 and the pillar structures 254 within each the tiers 248 of the stack structure 242 comprise so-called "MONOS" (metal-oxide-nitride-oxide-semiconductor) memory cells. In additional embodiments, the memory cells 256 comprise so-called "TANOS" (tantalum nitride-aluminum oxide-nitride-oxide-semiconductor) memory cells, or so-called "BETANOS" (band/barrier engineered TANOS) memory cells, each of which are subsets of MONOS memory cells. In further embodiments, the memory cells 256 comprise so-called "floating gate" memory cells including floating gates (e.g., metallic floating gates) as charge storage structures. The floating gates may horizontally intervene between central structures of the pillar structures 254 and the conductive structures 244 of the different tiers 248 of the stack structure 242. The microelectronic device 201 may include any desired quantity and distribution of the pillar structures 254 within the memory array region 242A of the stack structure 242.

The microelectronic device 201 may further include digit lines 262 (e.g., data lines, bit lines) vertically overlying the stack structure 242 and at least one source structure 260 (e.g., source line, source plate) vertically underlying the stack structure 242. The pillar structures 254 may vertically extend between the digit lines 262 and the source structure 260. The digit lines 262 and the source structure 260 may each individually be formed of and include at least one electrically conductive material, such as one or more of at least one metal (e.g., W, Ti, Mo, Nb, V, Hf, Ta, Cr, Zr, Fe, Ru, Os, Co, Rh, Ir, Ni, Pa, Pt, Cu, Ag, Au, Al), at least one alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), at least one conductively doped semiconductor material (e.g., conductively doped polysilicon, conductively doped Ge, conductively doped SiGe), and at least one conductive metal-containing material (e.g., a conductive metal nitride, a conductive metal silicide, a conductive metal carbide, a conductive metal oxide).

With continued reference to FIG. 2, within horizontal boundaries of the staircase region 242B of the stack structure 242, the stack structure 242 may include at least one staircase structure 250. The staircase structure 250 includes steps 252 at least partially defined by horizontal ends (e.g., in the X-direction) of the tiers 248. The steps 252 of the staircase structure 250 may serve as contact regions to electrically couple the conductive structures 244 of the tiers 248 of the stack structure 242 to other components (e.g., features, structures, devices) of the microelectronic device 201, as described in further detail below. The staircase structure 250 may include a desired quantity of steps 252. In addition, as shown in FIG. 2, in some embodiments, the steps 252 of each of the staircase structure 250 are arranged in order, such that steps 252 directly horizontally adjacent (e.g., in the X-direction) one another correspond to tiers 248 of the stack structure 242 directly vertically adjacent (e.g., in the Z-direction) one another. In additional embodiments, the steps 252 of the staircase structure 250 are arranged out of order, such that at least some steps 252 of the staircase structure 250 directly horizontally adjacent (e.g., in the X-direction) one another correspond to tiers 248 of stack structure 242 not directly vertically adjacent (e.g., in the Z-direction) one another.

Still referring to FIG. 2, the microelectronic device 201 may further include lower conductive structures 204 physically and electrically contacting at least some (e.g., each) of the steps 252 of the staircase structure 250 of the stack structure 242 to provide electrical access to the conductive structures 244 of the stack structure 242. The lower conductive structures 204 may be coupled to the conductive structures 244 of the tiers 248 of the stack structure 242 at the steps 252 of the staircase structure 250. The lower conductive structures 204 may correspond to the lower conductive structures 104 previously described herein with reference to FIG. 1A. As shown in FIG. 2, the lower conductive structures 204 may physically contact and upwardly vertically extend (e.g., in the positive Z-direction) from the conductive structures 244 at the steps 252 of the staircase structure 250 to the lower contact structures 210 of the vertical transistors 240 (wherein the vertical transistors 240, including the features therein, correspond to the vertical transistors 140 previously described with reference to FIG. 1K).

The microelectronic device 201 may further include a first isolation material 202 on or over the stack structure 242, a second isolation material 212 on or over the first isolation material 202, and a third isolation material 222 on or over the second isolation material 212. The first isolation material 202, the second isolation material 212, and the third isolation material 222 may respectively correspond to the first isolation material 102, the second isolation material 112, and the third isolation material 122 of the previously described with reference to FIGS. 1A through 1K. As shown in FIG. 2, the first isolation material 202 may be vertically interposed (e.g., in the Z-direction) between the stack structure 242 and the second isolation material 212. The first isolation material 202 may substantially cover the staircase structure 250 within the staircase region 242B of the stack structure 242, and may substantially surround side surfaces (e.g., sidewalls) of the lower conductive structures 204 on the steps 252 of the staircase structure 250. The first isolation material 202 may exhibit a substantially planer upper vertical boundary, and a substantially non-planar lower vertical boundary complementary to the topography of at least the stack structure 242 (including the staircase structure 250 thereof) thereunder.

As shown in FIG. 2, the vertical transistors 240 (including the lower contact structures 210, the gate structures 220, the gate dielectric structures 226, the channel structures 228, the dielectric fill structures 230, and the upper contact structures 236 thereof) may be located vertically above (e.g., in the Z-direction) and at least partially (e.g., substantially) within horizontal boundaries (e.g., in the X-direction and the Y-direction) of the staircase region 242B of the stack structure 242. The vertical transistors 240 and the upper conductive structures 238 may, for example, be employed as portions of a driver assembly (e.g., a string driver assembly) for the microelectronic device 201. As described in further detail below, the vertical transistors 240 may, for example, be employed as driver transistors (e.g., string driver transistors) for the microelectronic device 201. The vertical transistors 240 may be electrically coupled to the conductive structures 244 of the stack structure 242 by way of the lower conductive structures 204.

While FIG. 2 depicts the vertical transistors 240 of the microelectronic device 201 as being located within horizontal boundaries (e.g., in the X-direction, in the Y-direction) of the staircase region 242B of the stack structure 242 of the microelectronic device 201, one or more portions of the vertical transistors 240 may be located outside of the horizontal boundaries of the staircase region 242B of the stack structure 242 of the microelectronic device 201. For example, one or more (e.g., all, less than all) of the vertical transistors 240 may be located outside of the horizontal boundaries of the staircase region 242B of the stack structure 242. In such embodiments, the geometric configurations of one or more of the lower conductive structures 204 and the upper conductive structures 238 connected (e.g., physically connected, electrically connected) to the one or more of the vertical transistors 240 may be modified relative to the geometric configurations depicted in FIG. 2 to facilitate electrical connections between the one or more vertical transistors 240 and one or more of the conductive structures 244 of the stack structure 242.

Thus, in accordance with embodiments of the disclosure, a microelectronic device comprises first conductive structures, first contact structures, channel structures, second contact structures, second conductive structures, conductive gate structures, gate and dielectric structures. The first conductive structures vertically extend through a first isolation material. The first contact structures are on the first conductive structures. Each of the first contact structures comprises oxide semiconductive material. The channel structures are on the first contact structure and vertically extend through a second isolation material on the first isolation material and a third isolation material on the second isolation material. Each of the channel structures comprises additional oxide semiconductive material having a relatively smaller metal concentration and relatively greater oxygen concentration than a metal concentration and an oxygen concentration in the oxide semiconductive material. The second contact structures are on the channel structures. The second contact structures each comprise the oxide semiconductive material. The second conductive structures are on the second contact structures. The conductive gate structures are on the second isolation material and horizontally neighbor the channel structures. The gate dielectric structures are horizontally interposed between the channel structures and the conductive gate structures.

Furthermore, in accordance with additional embodiments of the disclosure, a memory device comprises a stack structure, a staircase structure, conductive pillar structures, string driver transistors, and strings of memory cells. The stack structure comprises a vertically alternating series of conductive structures and insulating structures arranged in tiers. The staircase structure is within the stack structure and has steps comprising edges of the tiers. The conductive structures are on the steps of the staircase structure. The string driver transistors vertically overlie the staircase structure. Each of the string driver transistors comprises a first contact structure, a channel structure, a second contact structure, a gate dielectric structure, and a gate electrode. The first contact structure is on one of the conductive structures and comprises a first indium-containing oxide semiconductive material. The channel structure is on the first contact structure and comprises a second indium-containing oxide semiconductive material lean in indium relative to the first indium-containing oxide semiconductive material. The second contact structure is on the channel structure and comprises a third indium-containing oxide semiconductive material rich in indium relative to the second indium-containing oxide semiconductive material. The gate dielectric structure horizontally neighbors an outer sidewall of the channel structure. The gate electrode horizontally neighbors an outer sidewall of the gate dielectric structure. The strings of memory cells vertically extend through the stack structure.

Figure 3:
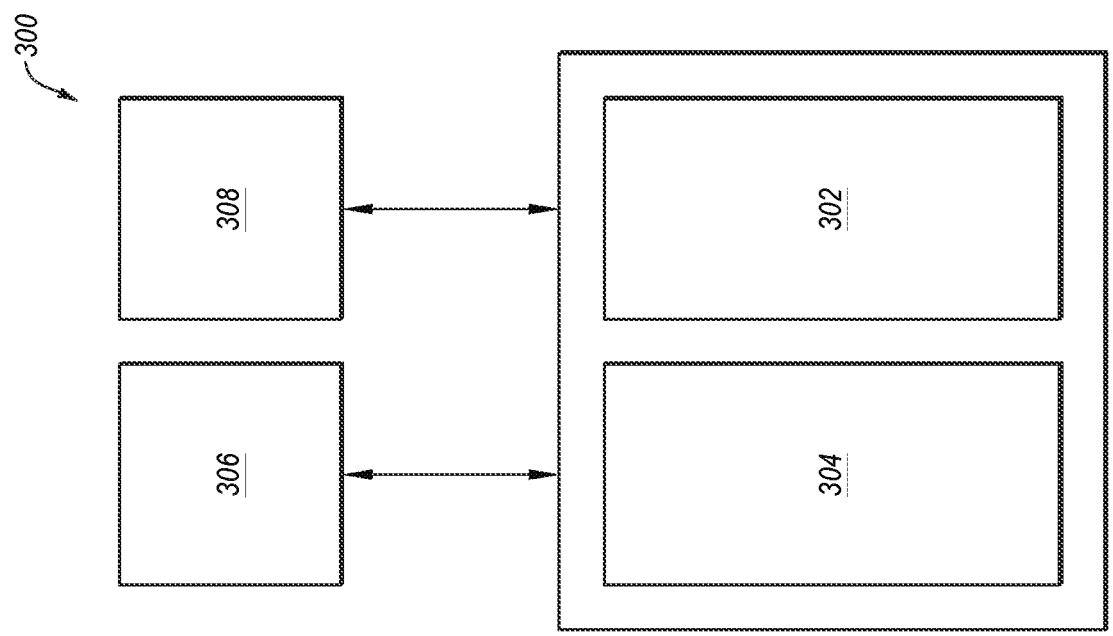
FIG. 3 is a schematic block diagram illustrating an electronic system, in accordance with embodiments of the disclosure.

Microelectronic device structures (e.g., the microelectronic device structure 100 previously described with reference to FIG. 1K) and microelectronic devices (e.g., the microelectronic device 201 previously described with reference to FIG. 2) in accordance with embodiments of the disclosure may be used in embodiments of electronic systems of the disclosure. For example, FIG. 3 is a block diagram of an illustrative electronic system 300 according to embodiments of disclosure. The electronic system 300 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The electronic system 300 includes at least one memory device 302. The memory device 302 may comprise, for example, an embodiment of one or more of a microelectronic device structure (e.g., the microelectronic device structure 100 previously described with reference to FIG. 1K) and a microelectronic device (e.g., the microelectronic device 201 previously described with reference to FIG. 2) previously described herein. The electronic system 300 may further include at least one electronic signal processor device 304 (often referred to as a "microprocessor"). The electronic signal processor device 304 may, optionally, include an embodiment of one or more of a microelectronic device structure (e.g., the microelectronic device structure 100 previously described with reference to FIG. 1K) and a microelectronic device (e.g., the microelectronic device 201 previously described with reference to FIG. 2). While the memory device 302 and the electronic signal processor device 304 are depicted as two (2) separate devices in FIG. 3, in additional embodiments, a single (e.g., only one) memory/processor device having the functionalities of the memory device 302 and the electronic signal processor device 304 is included in the electronic system 300. In such embodiments, the memory/processor device may include one or more of a microelectronic device structure (e.g., the microelectronic device structure 100 previously described with reference to FIG. 1K) and a microelectronic device (e.g., the microelectronic device 201 previously described with reference to FIG. 2) previously described herein. The electronic system 300 may further include one or more input devices 306 for inputting information into the electronic system 300 by a user, such as, for example, a mouse or other pointing device, a keyboard, a touchpad, a button, or a control panel. The electronic system 300 may further include one or more output devices 308 for outputting information (e.g., visual or audio output) to a user such as, for example, a monitor, a display, a printer, an audio output jack, a speaker, etc. In some embodiments, the input device 306 and the output device 308 may comprise a single touchscreen device that can be used both to input information to the electronic system 300 and to output visual information to a user. The input device 306 and the output device 308 may communicate electrically with one or more of the memory device 302 and the electronic signal processor device 304.

Thus, in accordance with embodiments of the disclosure, an electronic system comprises an input device, an output device, a processor device operably coupled to the input device and the output device, and a memory device operably coupled to the processor device. The memory device comprises a stack structure, strings of memory cells, conductive pillar structures, and transistors. The stack structure has tiers comprising conductive structures and insulating structures vertically neighboring the conductive structures. The stack structure comprises a staircase region comprising a staircase structure having steps comprising horizontal ends of the tiers, and a memory array region horizontally neighboring the staircase region. The strings of memory cells are within the memory array region of the stack structure. The conductive pillar structures are on the steps of the staircase structure. The transistors vertically overlie and are within horizontal boundaries of the staircase region of the stack structure. Each of the transistors comprises a lower contact structure, a channel structure, a dielectric structure, an upper contact structure, a gate dielectric structure, and a gate electrode. The lower contact structure is electrically coupled to one of the conductive pillar structures and comprises indium and oxygen. The channel structure is on the lower contact structure and comprises less indium and more oxygen than the lower contact structure. The dielectric structure is directly adjacent a sidewall of the channel structure and has a recessed upper surface relative to the channel structure. The upper contact structure is on the channel structure and the dielectric structure and comprises more indium and less oxygen than the channel structure. The gate dielectric structure is directly adjacent an additional sidewall of the channel structure. The gate electrode is directly adjacent a sidewall of the gate dielectric structure.

The structures, devices, and systems of the disclosure advantageously facilitate one or more of improved simplicity, greater packaging density, and increased miniaturization of components as compared to conventional structures, conventional devices, and conventional systems. The methods and structures of the disclosure facilitate the formation of devices (e.g., transistors, microelectronic devices, memory devices) and systems (e.g., electronic systems) having one or more of increased performance, improved on-state current properties, more components, less component congestion, smaller horizontal dimensions, increased efficiency, increased reliability, and increased durability as compared to conventional devices (e.g., conventional transistors, conventional microelectronic devices, conventional memory devices) and conventional systems (e.g., conventional electronic systems).

While the disclosure is susceptible to various modifications and alternative forms, specific embodiments have been shown by way of example in the drawings and have been described in detail herein. However, the disclosure is not limited to the particular forms disclosed. Rather, the disclosure is to cover all modifications, equivalents, and alternatives falling within the scope of the following appended claims and their legal equivalents.

What is claimed is:

1. A memory device, comprising:
a stack structure including tiers each comprising conductive material and insulative material vertically neighboring the conductive material, the stack structure having a memory array region and a staircase region horizontally neighboring the memory array region;
strings of memory cells within a horizontal area of the memory array region and vertically extending through the stack structure;
a staircase structure within a horizontal area of the staircase region and having steps comprising horizontal ends of at least some of the tiers of the stack structure;
conductive contact structures in contact with the conductive material of the at least some of the tiers of the stack structure at the steps of the staircase structure; and
vertical transistors vertically overlying the stack structure and within the horizontal area of the staircase region, at least one of vertical transistors comprising:
indium-containing material having:
a bottom section coupled to one of the conductive contact structures;
a top section vertically overlying the bottom section; and
a middle section vertically extending from and between the bottom section and the top section, the middle section having a lower atomic concentration of indium than each of the bottom section and the top section;
conductive gate material horizontally neighboring and within vertical boundaries of the middle section of the indium-containing material; and
gate dielectric material horizontally extending from and between the middle section of the indium-containing material and the conductive gate material, the middle section of the indium-containing material and the gate dielectric material each substantially confined within a horizontal area of the bottom section of the indium-containing material.

2. The memory device of claim 1, wherein the middle section of the indium-containing material of the at least one of vertical transistors comprises:
a lower surface in physical contract with an upper surface of the lower section of the indium-containing material;
outer side surfaces in physical contract with dielectric material; and
inner side surfaces opposing the outer side surfaces and in physical contact with dielectric fill material.

3. The memory device of claim 2, wherein the lower surface of the middle section of the indium-containing material is substantially confined within a horizontal area of the upper surface of the lower section of the indium-containing material, the lower surface of the middle section of the indium-containing material having a smaller horizontal area than the horizontal area of the upper surface of the lower section of the indium-containing material.

4. The memory device of claim 3, wherein:
a lowermost vertical boundary of the outer side surfaces of the middle section of the indium-containing material is substantially coplanar with a lowermost vertical boundary of the dielectric material; and
an uppermost vertical boundary of the outer side surfaces of the middle section of the indium-containing material is substantially coplanar with an uppermost vertical boundary of the dielectric material.

5. The memory device of claim 4, wherein:
a lowermost vertical boundary of the inner side surfaces of the middle section of the indium-containing material vertically overlies the lowermost vertical boundary of the dielectric material; and
an uppermost vertical boundary of the inner side surfaces of the middle section of the indium-containing material is substantially coplanar with the uppermost vertical boundary of the dielectric material.

6. A memory device, comprising:
a stack structure including tiers each comprising conductive material and insulative material vertically neighboring the conductive material, the stack structure having a memory array region and a staircase region horizontally neighboring the memory array region;
strings of memory cells within a horizontal area of the memory array region and vertically extending through the stack structure;
a staircase structure within a horizontal area of the staircase region and having steps comprising horizontal ends of at least some of the tiers of the stack structure;
conductive contact structures in contact with the conductive material of the at least some of the tiers of the stack structure at the steps of the staircase structure; and
vertical transistors vertically overlying the stack structure and within the horizontal area of the staircase region, at least one of vertical transistors comprising:
indium-containing material having:
a bottom section coupled to one of the conductive contact structures;
a top section vertically overlying the bottom section; and
a middle section vertically extending from and between the bottom section and the top section, the middle section having a lower atomic concentration of indium than each of the bottom section and the top section and comprising:
a lower surface in physical contract with and substantially confined within a horizontal area of an upper surface of the lower section of the indium-containing material, the lower surface of the middle section of the indium-containing material having a smaller horizontal area than the horizontal area of the upper surface of the lower section of the indium-containing material;
outer side surfaces in physical contract with dielectric material, the outer side surfaces comprising:
a lowermost vertical boundary substantially coplanar with a lowermost vertical boundary of the dielectric material; and
an uppermost vertical boundary substantially coplanar with an uppermost vertical boundary of the dielectric material; and
inner side surfaces opposing the outer side surfaces and in physical contact with dielectric fill material having an upper surface vertically underlying the uppermost vertical boundary of the dielectric material, the inner side surfaces comprising:
a lowermost vertical boundary vertically overlying the lowermost vertical boundary of the dielectric material; and an uppermost vertical boundary substantially coplanar with the uppermost vertical boundary of the dielectric material;
conductive gate material horizontally neighboring and within vertical boundaries of the middle section of the indium-containing material; and
the dielectric material, the dielectric material horizontally extending from and between the middle section of the indium-containing material and the conductive gate material.

7. The memory device of claim 6, wherein the top section of the indium-containing material of the at least one of vertical transistors comprises:
a lower portion in physical contact with the inner side surfaces of the middle section of the indium-containing material and the upper surface of the dielectric fill material; and
an upper portion vertically overlying the lower portion and horizontally extending beyond horizontal boundaries of the lower portion, the upper portion vertically overlying and in physical contact with upper surfaces of the middle section of the indium-containing material and the dielectric material.

8. The memory device of claim 7, wherein outer horizontal boundaries of the upper portion of the top section of the indium-containing material and are substantially coplanar with inner horizontal boundaries of the conductive gate material.

9. The memory device of claim 7, wherein a lowermost vertical boundary of the lower portion of the top section of the indium-containing material is vertically positioned at or below an uppermost vertical boundary of the conductive gate material.

10. The memory device of claim 1, wherein the lower section and the top section of the indium-containing material are individually heterogeneous by amounts of indium increasing in directions extending away from the middle section of the indium-containing material.

11. The memory device of claim 1, wherein the lower section and the top section of the indium-containing material are individually heterogeneous by amounts of oxygen increasing in directions extending toward the middle section of the indium-containing material.

12. The memory device of claim 1, wherein the lower section, the top section, and the middle section of the indium-containing material are individually selected from an indium oxide material, an indium zinc oxide material, an indium gallium zinc oxide material, an indium gallium silicon oxide material, and an indium tungsten oxide material.

13. A 3D NAND Flash memory device, comprising:
a stack structure comprising conductive structures vertically alternating with insulative structures;
pillar structures comprising semiconductive material extending through the stack structure;
a staircase structure having steps partially defined by horizontal ends of at least some of the conductive structures of the stack structure;
conductive contact structures in physical contact with the steps of the staircase structure;
string driver transistors vertically overlying and horizontally overlapping the staircase structure, the string driver transistors individually comprising:
a heterogeneous lower contact structure in physical contact with one of the conductive contact structures and including a first material comprising:
a first atomic concentration of indium; and
a first atomic concentration of oxygen;
a channel structure in physical contact with the heterogeneous lower contact structure and including a second material comprising:
a second atomic concentration of indium less than the first atomic concentration of indium; and
a second atomic concentration of oxygen greater than the first atomic concentration of oxygen;
a heterogeneous upper contact structure in physical contact with the channel structure and having a non-planar lower boundary, the heterogeneous upper contact structure including a third material comprising:
a third atomic concentration of indium greater than the second atomic concentration of indium; and
a third atomic concentration of oxygen less than the second atomic concentration of oxygen;
gate dielectric material in physical contact with and substantially covering outer side surfaces of the channel structure, the channel structure and the gate dielectric material each substantially confined within a horizontal area of the heterogeneous lower contact structure; and
gate electrode material in physical contact with and partially covering outer side surfaces of the gate dielectric material.

14. The 3D NAND Flash memory device of claim 13, wherein the heterogeneous upper contact structure is substantially confined within the horizontal area of the heterogeneous lower contact structure, an upper portion of the heterogeneous upper contact structure extending beyond outer horizontal boundaries of the channel structure.

15. The 3D NAND Flash memory device of claim 13, further comprising an isolation material comprising:
a lower surface substantially coplanar with an upper surface of the heterogeneous lower contact structure;
an upper surface substantially coplanar within and in physical contact with a lower surface of the gate electrode material; and
side surfaces substantially coplanar within and in physical contact with the outer side surfaces of the gate dielectric material.

16. The 3D NAND Flash memory device of claim 13, wherein the heterogeneous lower contact structure and the heterogeneous upper contact structure individually exhibit progressively decreasing amounts of indium and progressively increasing amounts of oxygen in directions extending toward the channel structure.

17. The 3D NAND Flash memory device of claim 16, wherein the heterogeneous lower contact structure, the channel structure, and the heterogeneous upper contact structure are individually selected from an indium oxide material, an indium zinc oxide material, an indium gallium zinc oxide material, an indium gallium silicon oxide material, and an indium tungsten oxide material.

18. An electronic system, comprising:
a processor device operably coupled to an input device and an output device; and
a memory device operably coupled to the processor device and comprising:
a stack structure including tiers each comprising conductive material and insulative material vertically neighboring the conductive material, the stack structure having a memory array region and a staircase region horizontally neighboring the memory array region;

pillar structures comprising semiconductive material within horizontal boundaries of the memory array region and vertically extending through the stack structure;
a staircase structure within horizontal boundaries of the staircase region and having steps comprising edges of at least some of the tiers of the stack structure;
conductive contact structures on the steps of the staircase structure; and
transistors vertically overlying the stack structure and within the horizontal boundaries of the staircase region, at least one of transistors comprising:
    a first indium-containing structure on one of the conductive contact structures;
    a second indium-containing structure over the first indium-containing structure;
    a third indium-containing structure vertically interposed between the first indium-containing structure and the second indium-containing structure, the third indium-containing structure having one or more of a lower atomic concentration of indium and a greater atomic concentration of oxygen than each of the first indium-containing structure and the second indium-containing structure;
    at least one gate electrode horizontally neighboring and within vertical boundaries of the third indium-containing structure; and
    gate dielectric material horizontally interposed between the third indium-containing structure and the at least one gate electrode, the gate dielectric material and the third indium-containing structure each substantially confined within a horizontal area of the first indium-containing structure.

* * * * *

UNITED STATES PATENT AND TRADEMARK OFFICE
CERTIFICATE OF CORRECTION

PATENT NO. : 11,908,948 B2
APPLICATION NO. : 17/821414
DATED : February 20, 2024
INVENTOR(S) : Kamal M. Karda et al.

It is certified that error appears in the above-identified patent and that said Letters Patent is hereby corrected as shown below:

In the Specification

Column 6, Line 35, change "iridium (Jr), nickel" to --iridium (Ir), nickel--
Column 15, Line 34, change "Rh, Jr, Ni," to --Rh, Ir, Ni,--

Signed and Sealed this
Twenty-third Day of April, 2024

Katherine Kelly Vidal
*Director of the United States Patent and Trademark Office*